United States Patent
Ralston et al.

(10) Patent No.: US 8,849,964 B2
(45) Date of Patent: Sep. 30, 2014

(54) MOBILE IMAGING APPLICATION, DEVICE ARCHITECTURE, SERVICE PLATFORM ARCHITECTURE AND SERVICES

(75) Inventors: John D. Ralston, Portola Valley, CA (US); Steven E. Saunders, Cupertino, CA (US); Krasimir D. Kolarov, Menlo Park, CA (US)

(73) Assignee: Soryn Technologies LLC, Jersey City, NJ (US)

( * ) Notice: Subject to any disclaimer, the term of this patent is extended or adjusted under 35 U.S.C. 154(b) by 0 days.

(21) Appl. No.: 13/037,296

(22) Filed: Feb. 28, 2011

(65) Prior Publication Data

US 2012/0106933 A1    May 3, 2012

Related U.S. Application Data

(66) Continuation of application No. 11/357,661, filed on Feb. 16, 2006, now abandoned, and a continuation-in-part of application No. 11/232,726, filed on Sep. 21, 2005, now Pat. No. 7,436,329, and a continuation-in-part of application No. 11/232,725, filed on Sep. 21, 2005, now abandoned, and a continuation-in-part of application No. 11/232,165, filed on Sep. 20, 2005, now Pat. No. 7,525,463, and a continuation-in-part of application No. 10/955,240, filed on Sep. 29, 2004, now abandoned, and a continuation-in-part of application No. 10/944,437, filed on Sep. 16, 2004, now abandoned, which is a continuation of application No. 10/418,831, filed on Apr. 17, 2003, now Pat. No. 6,825,780, and a continuation-in-part of application No. 10/447,455, filed on May 28, 2003, now abandoned, and a continuation-in-part of application No. 10/447,514, filed on May 28, 2003, now Pat. No. 7,844,122, and a continuation-in-part of application No. 10/418,649, filed on Apr. 17, 2003, now abandoned, and a continuation-in-part of application No. 10/418,363, (Continued)

(51) Int. Cl.
*G06F 15/177*    (2006.01)

(52) U.S. Cl.
USPC ........................................................ 709/220

(58) Field of Classification Search
CPC ............................... H04L 67/34; H04L 67/06
USPC ........................................................ 709/220
See application file for complete search history.

(56) References Cited

U.S. PATENT DOCUMENTS 4,813,056 A   3/1989   Fedele
5,574,449 A   11/1996  Golin (Continued)

FOREIGN PATENT DOCUMENTS

WO   WO2005/022530   *   3/2005   ............. G11B 20/00

OTHER PUBLICATIONS

Chan et al. A Joint Source Coding-Power Control Approach Combined with Adaptive Channel Coding for Video Transmission over CDMA Cellular Networks. 2003 IEEE. pp. 3415-3419.*

(Continued)

*Primary Examiner* — Bryan Lee
(74) *Attorney, Agent, or Firm* — Barnes & Thornburg LLP; Thomas J. McWilliams; Edward F. Behm, Jr.

(57) ABSTRACT

Systems and methods are provided for compressing and decompressing still image and video image data in mobile devices and monitoring applications. Corresponding mobile device and camera architectures, and service platform architectures for transmitting, storing, editing and transcoding still images and video images over wireless and wired networks and viewing them on display-enabled devices are also provided.

4 Claims, 24 Drawing Sheets

Self-playing Video MMS Eliminates Need for Transcoding

Related U.S. Application Data filed on Apr. 17, 2003, now abandoned, and a continuation of application No. 10/418,831, filed on Apr. 17, 2003, now Pat. No. 6,825,780, Substitute for application No. 60/374,069, filed on Apr. 19, 2002.

(60) Provisional application No. 60/612,652, filed on Sep. 22, 2004, provisional application No. 60/612,311, filed on Sep. 21, 2004, provisional application No. 60/507,148, filed on Sep. 30, 2003, provisional application No. 60/507,147, filed on Sep. 30, 2003, provisional application No. 60/612,311, filed on Sep. 21, 2004, provisional application No. 60/374,061, filed on Apr. 19, 2002, provisional application No. 60/390,380, filed on Jun. 21, 2002, provisional application No. 60/385,253, filed on May 28, 2002, provisional application No. 60/385,250, filed on May 28, 2002, provisional application No. 60/390,345, filed on Jun. 21, 2002, provisional application No. 60/390,492, filed on Jun. 21, 2002, provisional application No. 60/373,974, filed on Apr. 19, 2002, provisional application No. 60/373,966, filed on Apr. 19, 2002, provisional application No. 60/385,254, filed on May 28, 2002, provisional application No. 60/390,383, filed on Jun. 21, 2002.

(56) References Cited

U.S. PATENT DOCUMENTS

| | | | |
|---|---|---|---|
| 6,121,904 | A | 9/2000 | Levine |
| 6,696,922 | B1 | 2/2004 | Wong et al. |
| 7,181,538 | B2 * | 2/2007 | Tam et al. ............... 709/246 |
| 7,606,427 | B2 * | 10/2009 | Malayath et al. ......... 382/232 |
| 8,103,264 | B2 * | 1/2012 | Qumei et al. ............. 455/418 |
| 2005/0038892 | A1 * | 2/2005 | Huang et al. ............. 709/227 |
| 2007/0016703 | A1 * | 1/2007 | Bozionek et al. ........... 710/68 |
| 2007/0260615 | A1 * | 11/2007 | Shen ........................ 707/100 |

OTHER PUBLICATIONS

U.S. Appl. No. 13/155,280—Jan. 31, 2014 PTO Office Action.

* cited by examiner

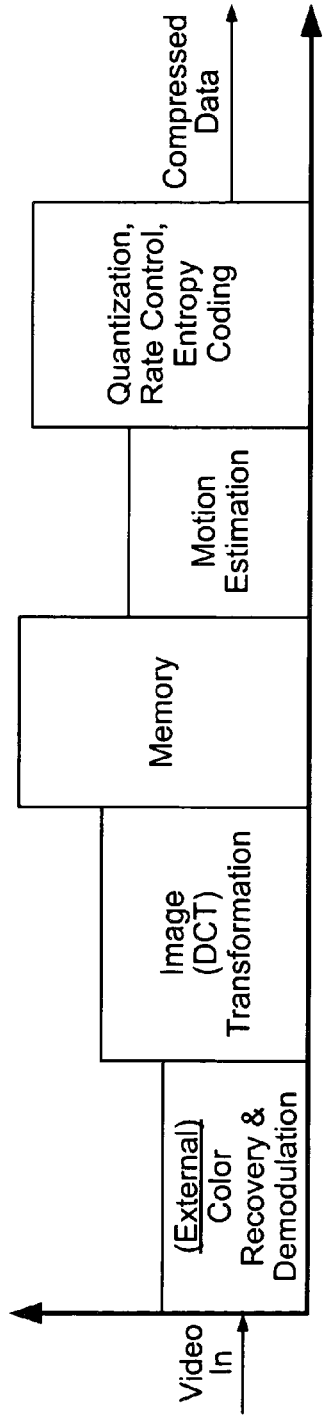
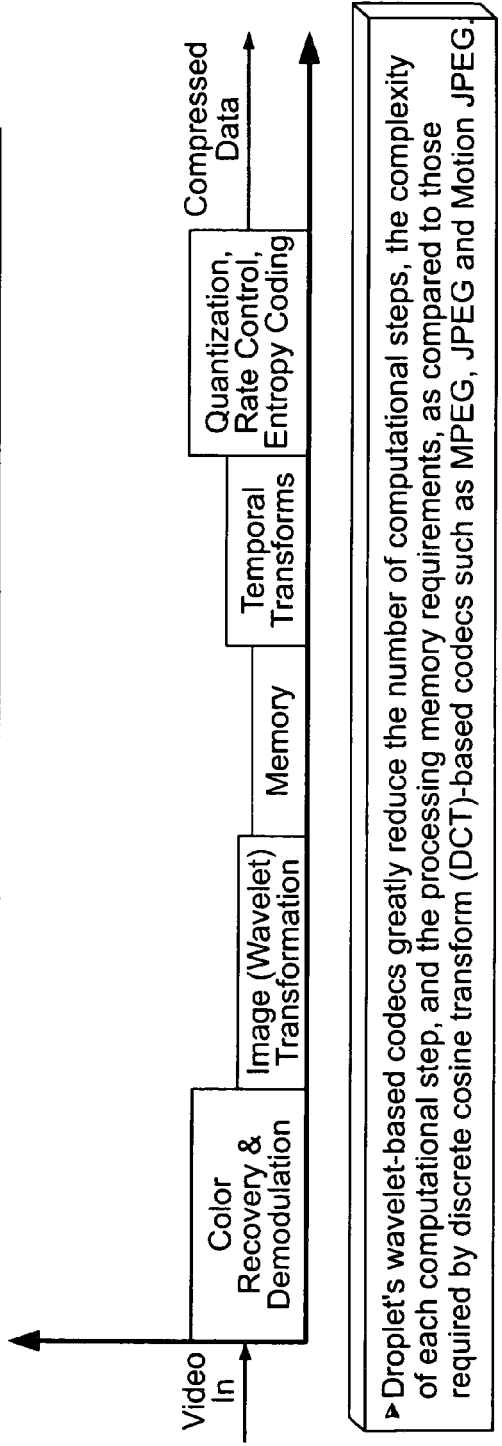
FIG. 5

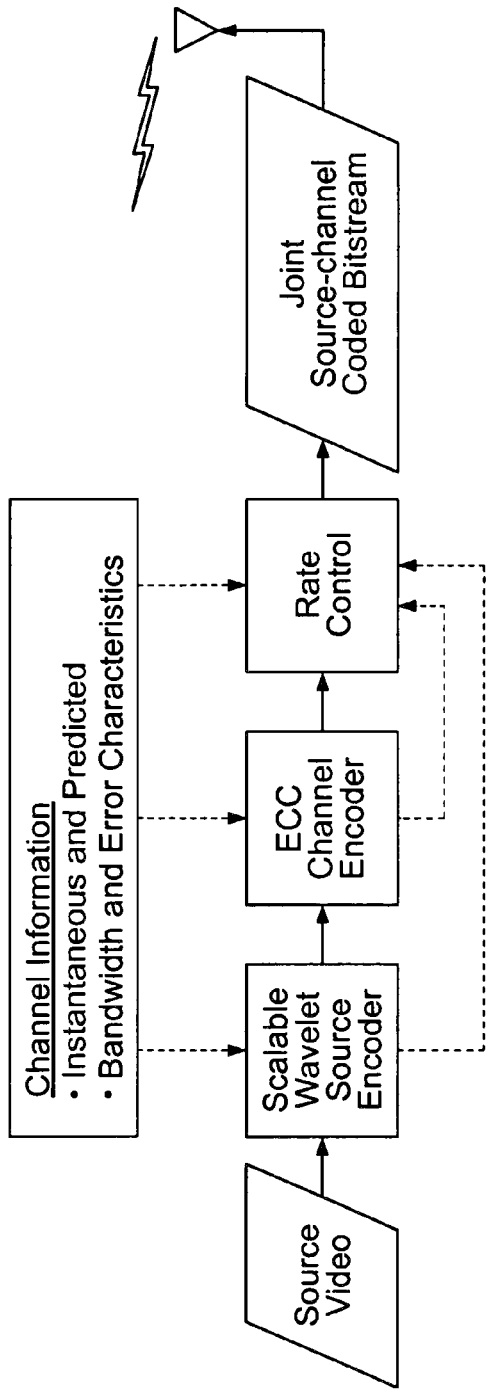
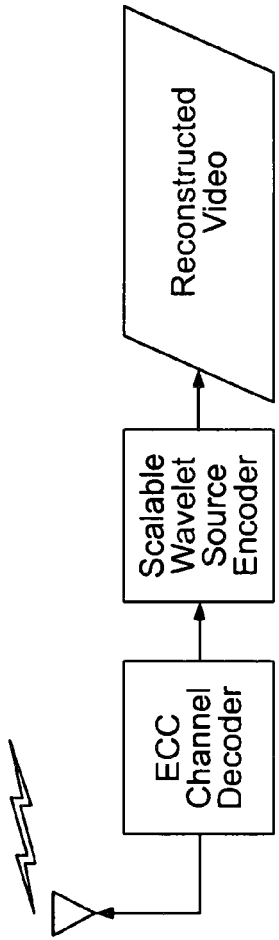
FIG. 6A
FIG. 6B

MOBILE IMAGING APPLICATION, DEVICE ARCHITECTURE, SERVICE PLATFORM ARCHITECTURE AND SERVICES

RELATED APPLICATIONS

The present application is a continuation of U.S. application Ser. No. 11/357,661, filed Feb. 16, 2006, now abandoned which claims priority to U.S. provisional application No. 60/654,058 filed Feb. 16, 2005. Both of which are incorporated by reference in their entireties.

The present application also incorporates by reference in its entirety U.S. application Ser. No. 11/232,165 filed Sep. 20, 2005; U.S. application Ser. No. 11/232,726 filed Sep. 21, 2005; U.S. application Ser. No. 11/232,725 filed Sep. 21, 2005; U.S. application Ser. No. 11/249,561 filed Oct. 12, 2005; and U.S. application Ser. No. 11/250,797 filed Oct. 13, 2005.

This application incorporates the following in their entirety for all purposes: Sweldens, Wim, The Lifting Scheme: A custom-design construction of biorthogonal wavelets. Appl. Com put. Harmon. Anal. 3(2):186-200, 1996; U.S. patent application Ser. No. 10/418,363 Filed: Apr. 17, 2003 entitled WAVELET TRANSFORM SYSTEM, METHOD AND COMPUTER PROGRAM PRODUCT with named inventors William C. Lynch, Krasimir D. Kolarov, and Steven E. Saunders; U.S. patent application Ser. No. 10/447,514 Filed: May 28, 2003 CHROMA TEMPORAL RATE REDUCTION AND HIGH-QUALITY PAUSE SYSTEM AND METHOD with named inventors Steven E. Saunders, Krasimir D. Kolarov, and William C. Lynch; U.S. patent application Ser. No. 10/447,455 Filed: May 28, 2003 PILE PROCESSING SYSTEM AND METHOD FOR PARALLEL PROCESSOR with named inventors William C. Lynch, Krasimir D. Kolarov, and Steven E. Saunders; Golomb, S. W. (1966). "Run-length encodings." IEEE Transactions on Information Theory, IT—12(3):399-401; R. F. Rice, "Some Practical Universal Noiseless Coding Techniques," Jet Propulsion Laboratory, Pasadena, Calif., JPL Publication 79-22, March 1979; J. Teuhola, "A Compression Method for Clustered Bit-Vectors," Information Processing Letters, vol. 7, pp. 308-311, October 1978; U.S. patent application Ser. No. 10/447,455 Filed: May 28, 2003 PILE PROCESSING SYSTEM AND METHOD FOR PARALLEL PROCESSORS with named inventors William C. Lynch, Krasimir D. Kolarov, and Steven E. Saunders.

The present application is a continuation of U.S. patent application Ser. No. 11/357,661 filed Feb. 2, 2006 entitled "Mobile Imaging Application, Device Architecture, Service Platform Architecture and Services; continuation-in-part of U.S. patent application Ser. No. 11/232,726 filed Sep. 21, 2005 entitled "Multiple Technique Entropy Coding System and Method" which claims priority from U.S. Provisional Application No. 60/612,652 filed Sep. 22, 2004; continuation-in-part of U.S. patent application Ser. No. 11/232,725 filed Sep. 21, 2005 entitled "Permutation Procrastination" which claims priority from U.S. Provisional Application No. 60/612,651 filed Sep. 22, 2004; continuation-in-part of U.S. application Ser. No. 11/232,165 filed Sep. 20, 2005 entitled "Compression Rate Control System and Method with Variable Subband Processing" which claims priority from U.S. Provisional Application No. 60/612,311 filed Sep. 21, 2004; continuation-in- part of U.S. patent application Ser. No. 10/955,240 filed Sep. 29, 2004 entitled "System and Method for Temporal Out-of-Order Compression and Multi-Source Compression Rate Control" now U.S. Publication No. US 2005/0105609 published on May 19, 2005, which claims priority from U.S. Provisional Application No. 60/612,311 filed Sep. 22, 2004, U.S. Provisional Application No. 60/507, 148 and U.S. Provisional Application No. 60/507,147 both filed Sep. 30, 2003; continuation-in-part of U.S. patent application Ser. No. 10/944,437 filed Sep. 16, 2004 entitled "Multiple Codec-Imager System and Method" now U.S. Publication No. US 2005/0104752 published on May 19, 2005, which is a continuation of U.S. Pat. No. 6,825,780 issued Nov. 30, 2004 which claims priority from U.S. Provisional Application No. 60/390,380 filed Jun. 21, 2002 and U.S. Provisional Application No. 60/374,061 filed Apr. 19, 2002; continuation-in-part of U.S. patent application Ser. No. 10/447,455 filed on May 28, 2003 entitled "Pile-Processing System and Method for Parallel Processors" now U.S. Publication No. US 2003/0229773 published on Dec. 11, 2003, which claims priority from U.S. Provisional Application Nos. 60/385,253 and 60/385,250 both filed on May 28, 2002; continuation-in-part of U.S. patent application Ser. No. 10/447,514 filed on May 28, 2003 entitled "Chrome Temporal Rate Reduction and High-Quality Pause System and Method" now U.S. Publication No.

US 2003/0235340 published on Dec. 25, 2003; which claims priority from U.S. Provisional Application Nos. 60/390,345 and 60/390,492 both filed on Jun. 21, 2002; continuation-in-part of U.S. patent application Ser. No. 10/418, 649 filed Apr. 17, 2003 entitled "System, Method and Computer Program Product for Image and Video Transcoding" now U.S. Publication No. US 2003/0206597 published on Nov. 6, 2003, which claims priority from U.S. Provisional Application No. 60/374,069 filed Apr. 19, 2002; continuation-in-part of U.S. patent application Ser. No. 10/418,363 filed Apr. 17, 2003 entitled "Wavelet Transform System, Method and Computer Program Product" now U.S. Publication No. US 2003/0198395 published on Oct. 23, 2003, which claims priority from U.S. Provisional Patent Application No. 60/390,383 filed on Jun. 21, 2002, U.S. Provisional Patent Application No. 60/385,254 filed May 28, 2002 and U.S. Provisional Application Nos. 60/373,974 and 60/373,966 both filed on Apr. 19, 2002; continuation of U.S. patent application Ser. No. 10/418,831 filed on Apr. 17, 2003 entitled "Multiple Codec-Imager System and Method" now U.S. Patent No. 6,825,780 issued on Nov. 30, 2004, which claims priority from U.S. Provisional Patent Application No. 60/390, 380 filed on Jun. 21, 2002 and U.S. Provisional Patent Application No. 60/374,061 filed April 19, 2002, each of which is incorporated herein by reference in its entirety.

This application also incorporates by reference in its entirety U.S. Pat. No. 6,847,317 issued on Jan. 25, 2005 entitled "System and Method for a Dyadic-Monotonic (DM) Codec"; and U.S. Pat. No. 6,825,780 issued on Nov. 30, 2004 entitled "Multiple Codec-Imager System and Method."

Directly digitized images and video take lots of bits; it is common to compress images and video for storage, transmission, and other uses. Several basic methods of compression are known, and very many specific variants of these. A general method can be characterized by a three-stage process: transform, quantize, and entropy-code. Most image and video compressors share this basic architecture, with variations.

The intent of the transform stage in a video compressor is to gather the energy or information of the source picture into as compact a form as possible by taking advantage of local similarities and patterns in the picture or sequence. No compressor can possibly compress all possible inputs; we design compressors to work well on "typical" inputs and ignore their failure to compress "random" or "pathological" inputs. Many image compression and video compression methods, such as MPEG-2 and MPEG-4, use the discrete cosine transform (DCT) as the transform stage. Some newer image compression and video compression methods, such as MPEG-4 static texture compression, use various wavelet transforms as the transform stage.

Quantization discards information after the transform stage; the reconstructed decompressed image cannot then be an exact reproduction of the original. Entropy coding is generally a lossless step: this step takes the information remaining after quantization and codes it so that it can be reproduced exactly in the decoder. Thus the design decisions about what information to discard is not affected by the following entropy-coding stage.

A limitation of DCT-based video compression/decompression (codec) techniques is that, having been developed originally for video broadcast and streaming applications, they rely on the encoding of video content in a studio environment, where high-complexity encoders can be run on computer workstations. Such computationally complex encoders allow computationally simple and relatively inexpensive decoders (players) to be installed in consumer playback devices. However, such asymmetric encode/decode technologies are a poor match to mobile multimedia devices, in which video messages must be captured in real time in the handset itself, as well as played back. As a result, video in mobile devices is typically limited to much smaller sizes and much lower frame rates than in other consumer products.

BACKGROUND OF THE INVENTION AND SUMMARY OF THE INVENTION

This invention pertains to methods, devices, systems, and architectures relating to still image and video image recording in devices, including mobile devices, corresponding mobile device architectures, service platform architectures and methods and services for transmitting, storing, editing, sharing, marketing, and transcoding still images and video images over wireless and wired networks and systems and viewing them on display-enabled devices, as well as network and other system services in relation to the foregoing. The present invention also pertains to improvements in the image recording technique, and corresponding improvements in the architectures of mobile devices and service platforms.

Aspects of the present invention comprise all-software video codecs/camcorder applications for compressing and/or decompressing video or still images. Aspects of the present invention also comprise infrastructure products, methods and processes, including mobile multimedia service (MMS) infrastructure applications, for deploying video messaging and sharing services in conjunction with software video codec/camcorder applications for mobile handsets as well as editing and transcoding applications to support complete interoperability with other commonly-deployed standards-based and proprietary video formats. Aspects of the invention also comprise methods, processes and business processes for establishing, enabling, distributing and operating innovative MMS services, including an innovative mobile video blog and marketing service for video content created by mobile users on mobile devices.

BRIEF DESCRIPTION OF FIGURES

FIG. 5 depicts a Video Codec Technology Comparison.

FIG. 6 depicts a system diagram for improved joint source-channel coding: (a) encoder; (b) decoder.

DETAILED DESCRIPTION OF THE INVENTION

Wavelet-Based Image Processing

Figure 1:
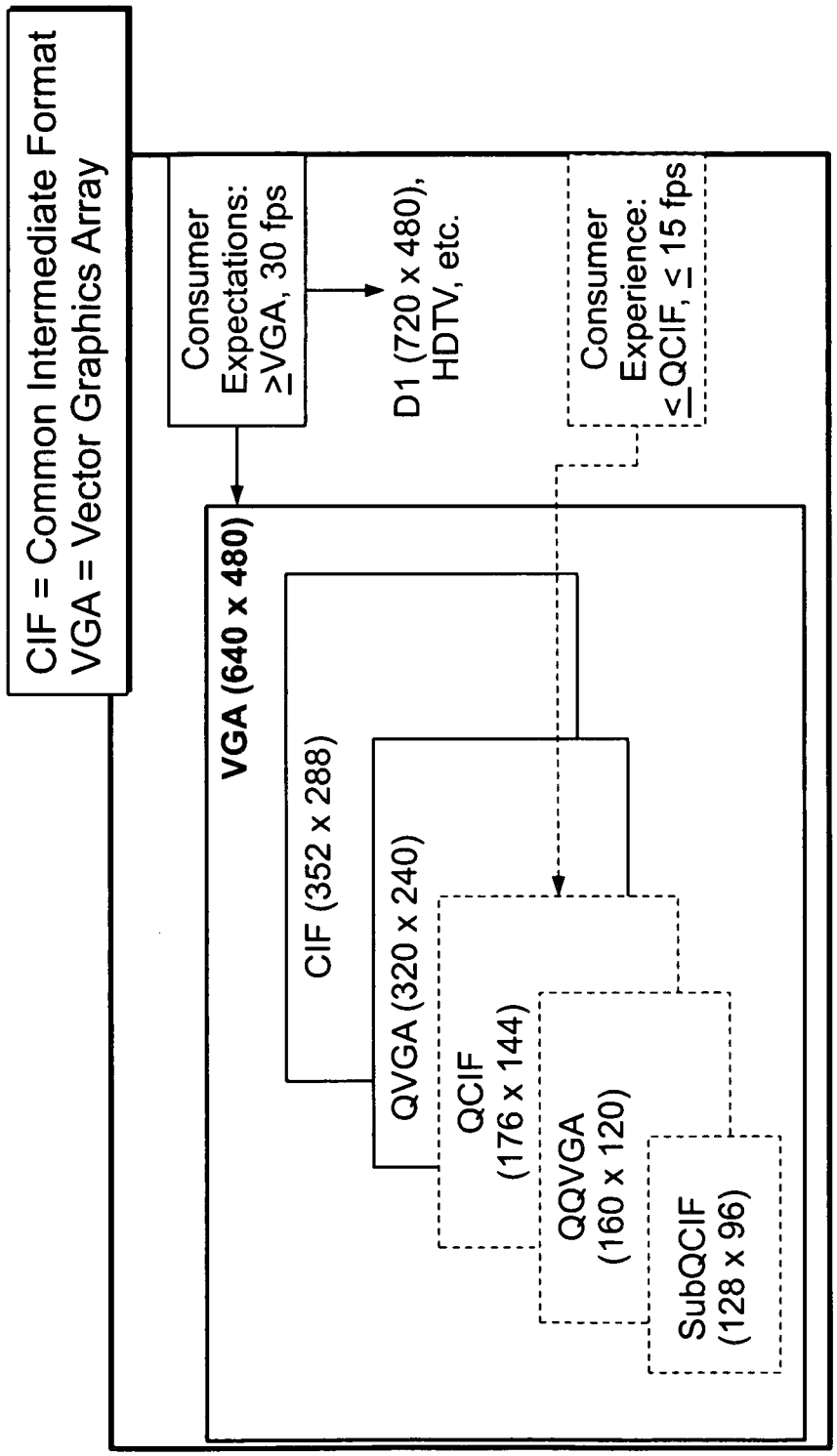
FIG. 1 depicts Video image size limitations in mobile image messaging.

A wavelet transform may comprise the repeated application of wavelet filter pairs to a set of data, either in one dimension, or in more than one. For still image compression, a 2-D wavelet transform (horizontal and vertical) can be utilized. Video codecs according to the present invention can use a 3-D wavelet transform (horizontal, vertical, and (temporal). An improved, symmetrical 3-D wavelet-based video compression/decompression (codec) device is desirable to reduce the computational complexity and power consumption in mobile devices well below those required for DCT-based codecs, as well as to enable simultaneous support for processing still images and video images in a single codec. Such simultaneous support for still images and video images in a single codec may eliminate or reduce the need for separate MPEG (video) and JPEG (still image) codecs, or greatly improve compression performance and hence storage efficiency with respect to Motion JPEG codecs. An improved, symmetrical 3-D wavelet-based video processing device is also desirable to reduce the computational complexity and power consumption in MMS infrastructure equipment utilized to support automated or manual editing of user-created video, as well as database storage, search, and retrieval of user-created video.

Mobile Video Messaging and Sharing Services

Aspects of the present invention comprise new methods, services and systems relating to innovative capture, compression, transmission, editing, storing and sharing video content associated with mobile devices. Aspects of the present invention may apply to telecom (both wireless and wireline providers) and internet, cable and other data and multimedia operators including fixed and mobile wireless service providers. Aspects of the present invention may provide for richer content, higher bandwidth usage and higher average revenue per user (ARPU). Mobile multimedia service (MMS) is the multimedia evolution of the text-based short message service (SMS). According to aspects of the present invention, a promising new MMS application presented is innovative video messaging and sharing, enabling a target audiences need to communicate personal information. Mobile image messaging and sharing may require the addition of digital camera functionality (still images) and/or camcorder functionality (video images) to mobile handsets, so that subscribers can both capture (encode) video messages that they wish to send, and play back (decode) video messages that they receive. Aspects of the present invention may also enable these functionalities in ways unavailable, if available at all, in the prior art.

According to aspects of the present invention, mobile devices may be enabled to evolve into integrated consumer multimedia entertainment platforms. A substantial investment in industry has been directed toward technologies and platforms that enable re-packaged broadcast television programming (such as news clips, sports highlights, and special "mobisodes" of popular TV programs) and other studio-generated video content (such as film previews and music videos) to be transmitted to and viewed on, mobile devices. In this later case, the mobile subscriber is exploited as a new class of video consumer. However, this later case utilizes largely video content that has been compressed in large broadcast enterprise servers. However, according to aspects of the present invention mobile operators worldwide also gain significant new opportunities to support their subscribers as media producers (as enabled by aspects of the present invention), rather than just media consumers. As enabled by aspects of the present invention, the ability to capture and share photographs and video on mobile devices with the same quality as stand-alone digital cameras and camcorders is a technical cornerstone for such new services, together with the deployment and convergence of higher speed cellular and fixed wireless data networks. Aspects of the present invention additionally enable significant reductions in the development cost and retail price of both camcorder phones and video messaging/sharing infrastructure equipment, which may be key to large scale commercial adoption of such devices and related mobile multimedia/data services, in both mature and emerging markets.

Prior mobile image messaging/sharing services and applications are severely limited to capturing and transmitting much smaller-size and lower-frame-rate video images than those typically captured and displayed on other multimedia devices (see FIG. 1), such as TVs, personal computers, digital video camcorders, and personal media players. Mobile image messaging services and applications capable of supporting VGA (or larger) video at a frame rate of 30 fps or higher, as provided by aspects of the present invention, would be preferable.

Adaptive Joint Source-Channel Coding

Figure 2A:
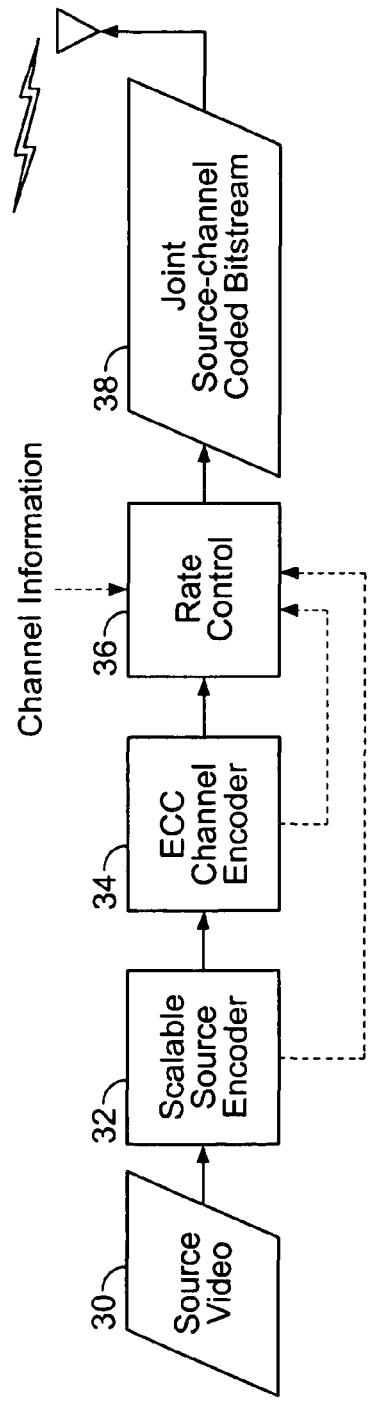
FIG. 2 depicts a system diagram for joint source-channel coding: (a) encoder; (b) decoder.
Figure 2B:
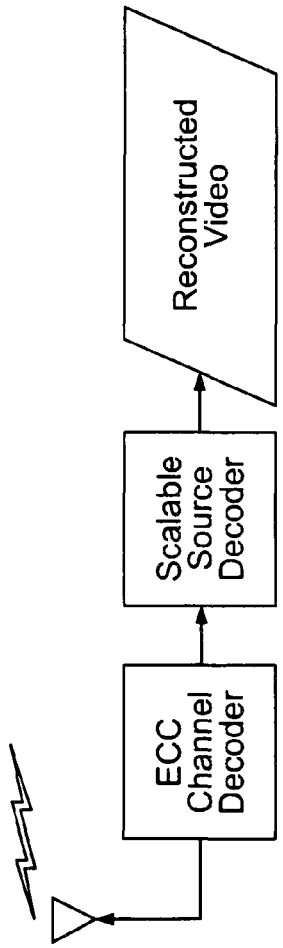

Video transmission over mobile networks is challenging in nature because of the higher data rates typically required, in comparison to the transmission of other data/media types such as text, audio, and still images. In addition, the limited and varying channel bandwidth, along with the fluctuating noise and error characteristics of mobile networks impose further constraints and difficulties on video transport. According to aspects of the present invention, various joint source-channel coding techniques can be applied to adapt the video bit stream to different channel conditions (see. FIG. 2). Such a joint source-channel coding approach according to aspects of the present invention may be scalable, in order to adapt to varying channel bandwidths and error characteristics. Also, according to aspects of the present invention, is supported scalability for multicast scenarios, in which different devices at the receiving end of the video stream may have different limitations on decoding computational power and display capabilities.

As shown in FIG. 2 and according to aspects of the present invention, the source video sequence 30 may be first source coded 32 (i.e. compressed), followed by error correction code (ECC) channel coding 34. In mobile networks, source coding typically uses such DCT-based compression techniques as, H.263, MPEG-4, or Motion JPEG. Example channel coding methods are Reed-Solomon codes, BCH codes, FEC codes, and turbo codes. The joint source and channel coded video bit stream then passes through the rate controller 36 to match the channel bandwidth requirement while achieving the best reconstructed video quality. The rate controller performs discrete rate-distortion computations on the compressed video bit stream before it sends the video bit stream for transmission over the channel 38. Due to limitations in computational power in mobile devices, typical rate controllers only consider the available channel bandwidth, and do not explicitly consider the error characteristics of the transmission channel.

It would be desirable, and is enabled by the present invention to utilize improved adaptive joint-source channel coding based on algorithms with higher computational efficiency, so that both instantaneous and predicted channel bandwidth and error conditions could be utilized in all three of the source coder 32, the channel coder 34, and the rate controller 36 to maximize control of both the instantaneous and average quality (video rate vs. distortion) of the reconstructed video signal.

A further benefit of such an improved adaptive joint-source channel coding technique, pursuant to aspects of the present invention, is the corresponding ability of wireless carriers and MMS service providers to offer a greater range of quality-of-service (QoS) performance and pricing levels to their consumer and enterprise customers, thus maximizing the revenues generated using their wireless network infrastructure.

Multicast scenarios require a single adaptive video bit stream that can be decoded by many users. This is especially important in modern, large-scale, heterogeneous networks, in which network bandwidth limitations make it impractical to transmit multiple simulcast video signals specifically tuned for each user. Multicasting of a single adaptive video bit stream greatly reduces the bandwidth requirements, but requires generating a video bit stream that is decodable for multiple users, including high-end users with broadband wireless or wire line connections, and wireless phone users, with limited bandwidth and error-prone connections. Due to limitations in computational power in mobile devices, the granularity of adaptive rate controllers is typically very coarse, for example producing only a 2-layer bit stream including a base layer and one enhancement layer.

It would be desirable, and is enabled via aspects of the present invention, to utilize improved adaptive joint-source channel coding based on algorithms with higher computational efficiency, in order to enable support for a much higher level of network heterogeneity, in terms of channel types (wireless and wire line), channel bandwidths, channel noise/error characteristics, user devices, and user services.

Mobile Imaging Handset Architecture

Figure 3:
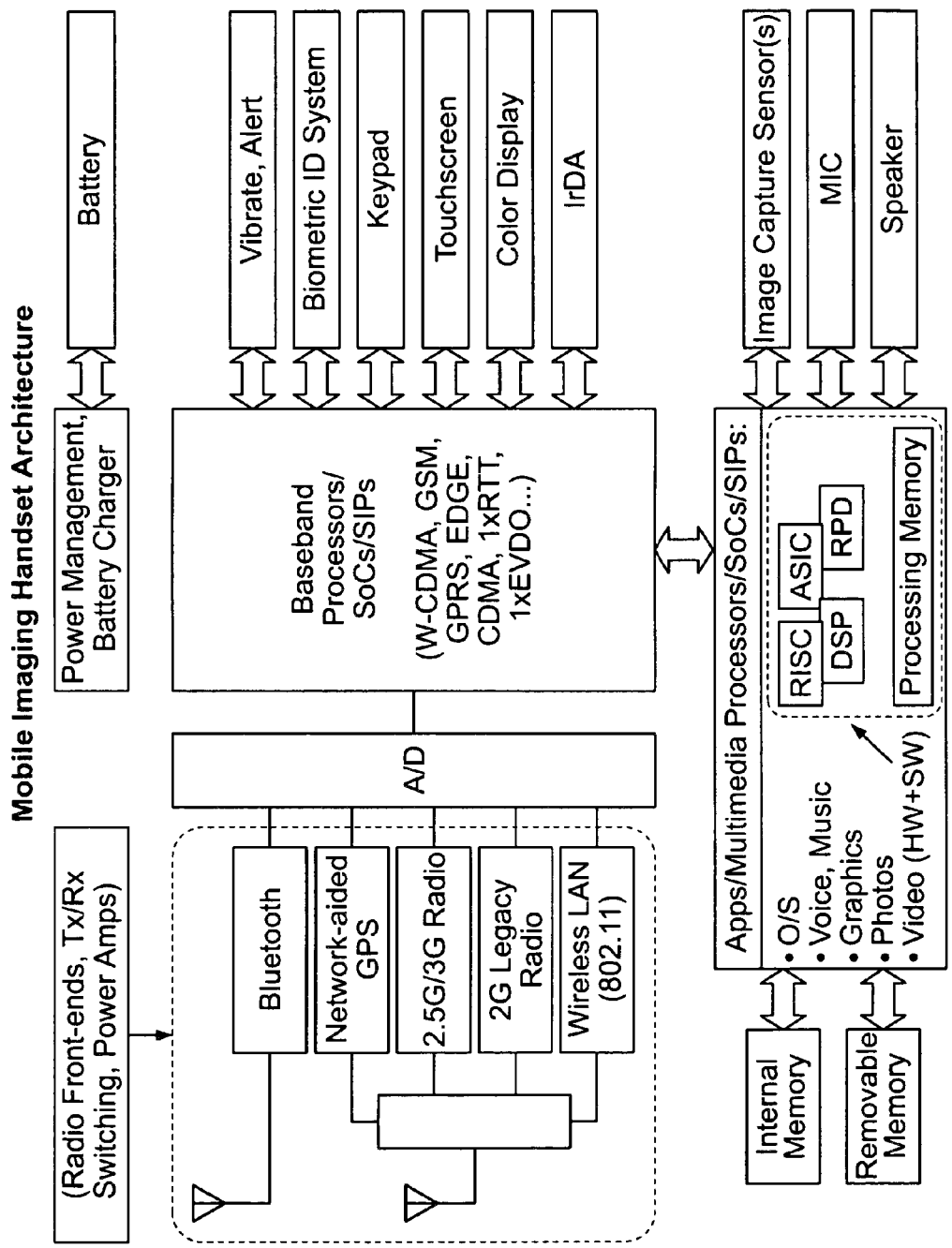
FIG. 3 depicts a Mobile Imaging Handset Architecture.

The addition of digital camcorder functionality to mobile handsets generally requires adding the following functions, either in hardware, software, or as a combination of hardware and software (see FIG. 3):

imager array (typically array of CMOS or CCD pixels), with corresponding pre-amplifiers and analog-to-digital (A/D) signal conversion circuitry image processing functions such as pre-processing, encoding/decoding (codec), post-processing buffering of processed images for non-real-time transmission or real-time streaming over wireless or wire line networks one or more image display screens local image storage on built-in or removable memory.

Using codecs based on DCT transforms, such as MPEG-4, commercially available imaging-enabled mobile handsets are limited to capturing smaller-size and lower-frame-rate video images than those typically captured and displayed on other multimedia devices, such as TVs, personal computers, digital video camcorders, and personal media players. These latter devices typically capture/display video images in VGA format (640×480 pixels) or larger, at a display rate of 30 frames-per-second (fps) or higher, whereas commercially available imaging-enabled mobile handsets are limited to capturing video images in QVGA format (320×240 pixels), QCIF format (176×144 pixels) or smaller, at a display rate of 15 fps or lower (See, e.g., FIG. 1). This reduced video capture capability is due to the excessive computational requirements, processor power consumption, and buffer memory required to complete the number, type, and sequence of computational steps associated with video compression/decompression using DCT transforms.

Using commercially available video codec and microprocessor technologies leads to very complex, power-hungry, and expensive architectures for mobile imaging handsets that target capture of VGA (or larger) video at a frame rate of 30 fps or higher. Such handset architectures require codecs that utilize a combination of both software programs and hardware accelerators running on a combination of reduced instructions set (RISC) processors, digital signal processors (DSPs), application-specific integrated circuits (ASICs), and reconfigurable processing devices (RPDs), together with larger buffer memory blocks (typical memory capacity of 1 Mbyte or more). These codec functions may be implemented using such RISC processors, DSPs, ASICs, multimedia processors, and RPDs as separate integrated circuits (ICs), or may combine one or more of the RISC processors, DSPs, ASICs, multimedia processors, and RPDs integrated together in a system-in-a-package (SIP) or system-on-a-chip (SoC).

Codec functions running on RISC processors or DSPs are typically software routines, with the advantage that they can be modified in order to correct programming errors or upgrade functionality. The disadvantage of implementing certain complex, repetitive codec functions as software is that the resulting overall processor resource and power consumption requirements typically exceeds those available in mobile communications devices. Codec functions running on ASICs and multimedia processors are typically fixed hardware implementations of complex, repetitive computational steps, with, typically, the advantage that specially tailored hardware acceleration can substantially reduce the overall power consumption of the codec. The disadvantages of implementing certain codec functions in fixed hardware include longer and more expensive design cycles, the risk of expensive product recalls in the case where errors are found in the fixed silicon implementation, and the inability to upgrade fixed silicon functions in deployed products in the case where newly developed features are to be added to the imaging application. Codec functions running on RPDs are typically routines that require both hardware acceleration and the ability to add or modify functionality in final mobile imaging handset products. The disadvantage of implementing certain codec functions on RPDs is the larger number of silicon gates and higher power consumption required to support hardware reconfigurability in comparison to fixed ASIC implementations.

An imaging application that reduces or eliminates complex, repetitive codec functions so as to enable mobile imaging handsets capable of capturing VGA (or larger) video at a frame rate of 30 fps with an all-software architecture would be preferable, in order to simplify the above architecture and enable handset costs compatible with high-volume commercial deployment. The present invention is the first technology to successfully accomplish and enable these objectives.

Multimedia handsets are required not only to support picture and video messaging capabilities, but also a variety of additional multimedia capabilities (voice, music, graphics) and a variety of fixed and mobile wireless access modes, including but not limited to 2.5G and 3G cellular access, WiBro, HSDPA, WiFi, wireless LAN, and Bluetooth. The complexity and risk involved in developing, deploying, and supporting such products makes over-the-air (OTA) distribution and management of many functions and applications highly beneficial, in order to more efficiently deploy new revenue-generating services and applications, and to avoid costly product recalls.

An all-SW imaging application would be preferable to enable OTA distribution and management of the imaging application by handset manufacturers, mobile operators, and other MMS service providers. Again, the present invention is the first technology to successfully enable these objectives.

Mobile Java Applications

Java technology brings a wide range of devices, from servers to desktops to mobile devices, together under one language and one technology. While the applications for this range of devices differ, Java technology works to bridge those differences where it counts, allowing developers who are functional in one area to leverage their skills across a wide spectrum of devices and applications.

First introduced to the Java community by Sun Microsystems in June 1999, J2ME (Java 2, Micro Edition) was part of a broad initiative to better meet the diverse needs of Java developers. With the Java 2 Platform, Sun redefined the architecture of the Java technology, grouping it into three editions. Standard Edition (J2SE) offered a practical solution for desktop development and low-end business: applications. Enterprise Edition (J2EE) was for developers specializing in applications for the enterprise environment. Micro Edition (J2ME)

was introduced for developers working on devices with limited hardware resources, such as PDAs, cell phones, pagers, television set top boxes, remote telemetry units, and many other consumer electronic and embedded devices.

J2ME is aimed at machines with as little as 128 KB of RAM and with processors a lot less powerful than those used on typical desktop and server computers. J2ME actually consists of a set of profiles. Each profile is defined for a particular type of device—cell phones, PDAs, etc.—and consists of a minimum set of class libraries required for the particular type of device and a specification of a Java virtual machine required to support the device. The virtual machine specified in any J2ME profile is not necessarily the same as the virtual machine used in Java 2 Standard Edition (J2SE) and Java 2 Enterprise Edition (J2EE).

It is very difficult to define a single J2ME technology that would be optimal, or even close to optimal, for all of the devices listed above, due to the differences in processor power, memory, persistent storage, and user interface. To address this problem, Sun divided and then subdivided the definition of devices suitable for J2ME into sections. First, Sun divided devices into two broad categories based on processing power, memory, and storage capability, with no regard for intended use. The company then defined a stripped-down version of the Java language that would work within the constraints of the devices in each category, while still providing at least minimal Java language functionality.

Next, Sun identified within each of these two categories classes of devices with similar roles—so, for example, all cell phones fell within one class, regardless of manufacturer. With the help of its partners in the Java Community Process (JCP), Sun then defined additional functionality specific to each class of devices:

The first division created two J2ME configurations: Connected Device Configuration (CDC) and Connected, Limited Device Configuration (CLDC). A configuration may be a Java virtual machine (JVM) and a minimal set of class libraries and APIs providing a run-time environment for a select group of devices. A configuration may specify a least common denominator subset of the Java language, one that fits within the resource constraints imposed by the family of devices for which it was developed. Because there is such great variability across user interface, function, and usage, a typical configuration does not define such important pieces as the user interface toolkit and persistent storage APIs. The definition of that functionality belongs, instead, to what is called a profile.

A J2ME profile may be a set of Java APIs specified by an industry-led group that is meant to address a specific class of device, such as pagers and cell phones. Each profile is built on top of the least common denominator subset of the Java language provided by its configuration, and is meant to supplement that configuration. Two profiles important to mobile handheld devices are: the Foundation profile, which supplements the CDC, and the Mobile Information Device Profile (MIDP), which supplements the CLDC. More profiles are in the works, and specifications and reference implementations continue to be developed and released.

The Java Technology for the Wireless Industry (JTWI) specification, JSR 185, defines the industry-standard platform for the next generation of Java technology-enabled mobile phones. JTWI is defined through the Java Community Process (JCP) by an expert group of leading mobile device manufacturers, wireless carriers, and software vendors. JTWI specifies the technologies that must be included in all JTWI-compliant devices: CLDC 1.0 (JSR 30), MIDP 2.0 (JSR 118), and WMA 1.1 (JSR 120), as well as CLDC 1.1 (JRS 139) and MMAPI (JSR 135) where applicable. Two additional JTWI specifications that define the technologies and interfaces for mobile multimedia devices are JSR-135 ("Mobile Media API") and JSR-234 ("Advanced Multimedia Supplements").

The JTWI specification raises the bar of functionality for high-volume devices, while minimizing API fragmentation and broadening the substantial base of applications that have already been developed for mobile phones. Benefits of JTWI include:

Interoperability: The goal of this effort is to deliver a predictable environment for application developers, and a deliverable set of capabilities for device manufacturers. The intent is that both benefit by adopting the JTW1 standard: manufacturers benefit from a broad range of compatible applications, software developers benefit from a broad range of devices that support their applications.

Clarification of security specification: The JSR 185 specification introduces a number of clarifications for untrusted applications with regard to the "Recommended Security Policy for GSM/UMTS-Compliant. Devices" defined in the MIDP 2.0 specification. It extends the base MIDlet suite security framework defined in MIDP 2.0.

Road map: A key feature of the JTWI specification is the road map, an outline of common functionality that software developers can expect in JTWI-compliant devices. January 2003 saw the first in a series of road maps expected to appear at six- to nine-month intervals, which will describe additional functionality consistent with the evolution of mobile phones. The road map enables all parties to plan for the future with more confidence: carriers can better plan their application deployment strategy, device manufacturers can better determine their product plans, and content developers can see a clearer path for their application development efforts. Carriers in particular will, in the future, rely on a Java VM to abstract/protect underlying radio/network functions from security breaches such as viruses, worms, and other "attacks" that currently plaque the public Internet.

A Java-based imaging application would be preferable for "write-once, run-anywhere" portability across all Java-enabled handsets, for Java VM security and handset/network robustness against viruses, worms, and other mobile network security "attacks", and for simplified OTA codec and application download procedures. Such a Java-based imaging application should conform to JTWI specifications JSR-135 ("Mobile Media API") and JSR-234 ("Advanced Multimedia Supplements"). Aspects of the present invention provide these advantages.

Mobile Imaging Service Platform Architecture

Figure 4:
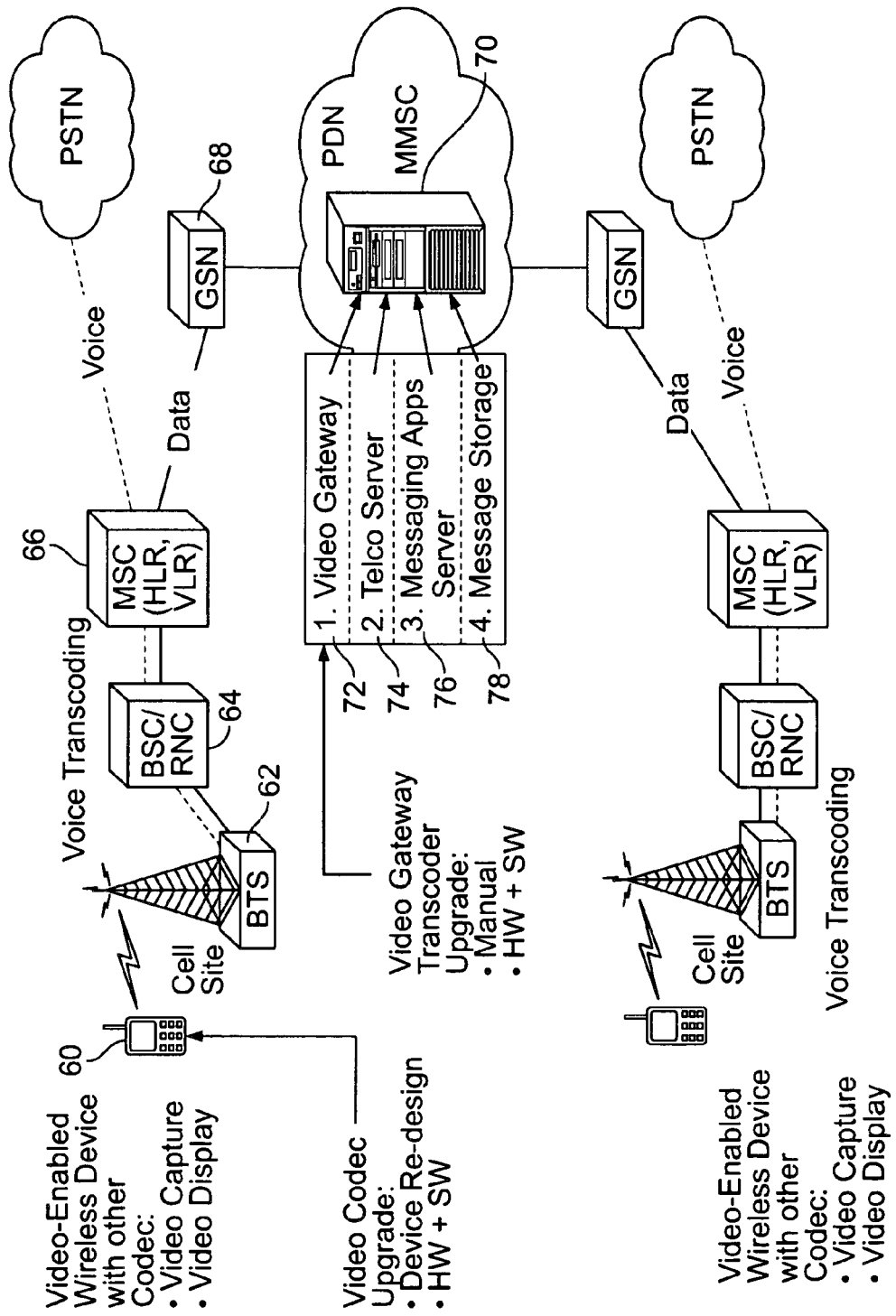
FIG. 4 depicts a Mobile Imaging Service Platform Architecture.

Key components of a mobile imaging service platform architecture according to aspects of the present invention (see FIG. 4) may include:
Mobile Handsets 60
Mobile Base stations (BTS) 62
Base station Controller/Radio Network Controller (BSC/RNC) 64
Mobile Switching Center (MSC) 66
Gateway Service Node (GSN) 68
Mobile Multimedia Service Controller (MMSC) 70
Typical functions included in the MMSC according to aspects of the present invention (see FIG. 4) include:
Video gateway 72
Telco server 74
MMS applications server 76
Storage server 78

The video gateway in an MMSC, according to aspects of the present invention, may serve to transcode between the different video formats that are supported by the imaging service platform. Transcoding is also utilized by wireless operators to support different voice codecs used in mobile telephone networks, and the corresponding voice transcoders are integrated into the RNC. Upgrading such a mobile imaging service platform with the architecture shown in FIG. 4 if found in prior architectures, would typically require deploying new handsets, and manually adding new hardware to the MMSC video gateway. In some mobile video messaging and sharing applications, it may be desirable to eliminate the cost and complexity associated with transcoding. One aspect of the current invention is the ability to embed a software decoder with each transmitted video stream, enabling "self-playing" functionality on common handset and PV video players.

The MMS applications servers in an MMSC may support applications such as automated or manual editing of user-created video, as well as database storage, search, and retrieval of user-created video. The computational complexity required to implement such functions requires specialized servers to be installed by mobile operators, with the corresponding video processing functions typically requiring expensive and high-power application-specific integrated circuits (ASICs) and digital signal processors (DSPs), rather than simpler SW applications running on less-expensive and lower-power CPU chips used in standard personal computers (PCs) and servers.

As is enabled by aspects of the present invention, an all-software mobile imaging applications service platform according to aspects of the present invention, would be preferable, in order to support automated OTA upgrade of deployed handsets, automated OTN upgrade of deployed MMSCs, and support for mobile video applications using standard PCs and servers. A Java implementation of the mobile handset imaging application, according to aspects of the present invention, may be preferable in terms of improved handset/network robustness against viruses, worms, and other "attacks", allowing mobile network operators to provide the quality and reliability of service required by national regulators.

Problem

The deployment of mobile video messaging and sharing services has exposed fundamental limitations of video compression technologies.

On the one hand, such mobile video services are being launched into a market that now equates video with home cinema quality broadcast—full size image formats such as VGA at 30 frames per second. On the other hand, processing of such large volumes of data using existing video technologies originally developed for broadcasting and streaming applications greatly exceeds the computing resources and battery power available for real-time video capture (encoding) in mobile handsets. Broadcast and streaming applications rely on the encoding of video content in a studio environment, where high-complexity encoders can be run on computer workstations. Since video messages must be captured in real time in the handset itself, they are limited to much smaller sizes and much lower frame rates.

As a result, today's mobile video services are primitive; pictures are small (QCIF, QVGA) and choppy (15 fps or less) in comparison to those that subscribers have long come to expect from the digital camcorders whose functionality video phones have been positioned to replicate. The primitive video image quality offered to mobile subscribers today also falls far short of the crisp high-definition video featured in the industry's lifestyle advertising. Mobile subscribers are demanding full VGA, 30 fps performance (i.e. just like their camcorder) before, they will widely adopt and pay premium pricing for camcorder phones and related mobile video services.

Even after highly expensive and time-consuming development programs, competing video codec providers apart from the present inventors can still only offer complex hybrid SW codec+HW accelerator solutions in attempts to provide VGA 30 fps performance, with overall cost and power consumption that far exceed commercial business requirements and technology capabilities. Handsets are thus limited to small choppy images, or expensive power-hungry architectures. Service deployment is too expensive, and quality of service is too low, to attract mass-market adoption.

Upgrading MMSC infrastructure is also costly if new or specialized hardware is required. An all-SW applications and service platform would be preferable in order to enable automated OTA upgrade of handsets, OTN upgrade of MMSC video gateways, and support for mobile video applications using standard PCs and servers. The need for transcoding between different video formats also adds additional cost and complexity.

Solution

The solution to this problem, particularly according to aspects of the present invention, is a much lower complexity imaging application (codec) that can be implemented as an all-SW application on mobile handsets, reducing the complexity of the handset architecture and the complexity of the mobile imaging service platform architecture. According to certain aspects of the present invention, an all-SW video codec solution substantially reduces or eliminates baseband processor and video accelerator costs and requirements in multimedia handsets. Combined with the ability to install the codec post-production via OTA download, this all-SW solution substantially reduces the complexity, risk, and cost of both handset development and video messaging service architecture and deployment. SW video transcoders and editing, storing, searching, retrieval applications according to the present invention enable automated over-the-network (OTN) upgrade of deployed MMS control (MMSC) infrastructure, as well as the use of standard PCs and servers to run such applications. Additionally, the present invention wavelet transcoders provide carriers with complete interoperability between the wavelet video format and other standards-based and proprietary video formats. The present invention also allows a software decoder to be embedded with each transmitted video stream, enabling "self-playing" functionality on common handset and PV video players, and eliminating the cost and complexity of transcoding altogether. The present invention's all-SW video platform allows rapid deployment of new MMS services, also parts of embodiments of the present invention, that leverage processing speed and video production accuracy not available with other existing technologies. Such new MMS services are themselves aspects of the current invention. The present invention's wavelet codecs are also unique in their ability to efficiently process both still images and video, and can thus replace separate MPEG and JPEG codecs with a single lower-cost and lower-power solution that can simultaneously support both mobile picture-mail and video-messaging services.

In the present description, certain aspects, figures, or embodiments are described as "Droplet" aspects or embodiments. In the present application, "Droplet" should be understood to refer to embodiments of the present invention.

Improved Wavelet-Based Image Processing

Aspects of the present invention utilize 3-D wavelet transforms in video compression/decompression (codec) devices with much lower computational complexity than DCT-based codecs (FIG. 5 provides a comparison of the relative computational requirements of a traditional DCT encoder technology and exemplary technologies of the present invention). The application of a wavelet transform stage also enables design of quantization and entropy-coding stages with greatly reduced computational complexity. Further advantages of the 3-D wavelet codecs of the present invention for mobile imaging applications, devices, and services include:

Symmetric, low-complexity video encoding and decoding
Lower processor power requirements for both SW and HW codec implementations
All-software encoding and decoding of VGA (or larger) video at a frame rate of 30 fps (or higher) with processor requirements compatible with existing commercial mobile handsets, both as native code and as a Java application
Lower gate-count ASIC cores for SoC integration
Lower buffer memory requirements
Single codec supports both still images (~JPEG) and video (~MPEG)
Simplified video editing (cuts, inserts, text overlays,) due to shorter group of pictures (GOP)
Simplified synchronization with voice codecs, due to shorter GOP
Low latency for enhanced video streaming, due to shorter GOP
Fine grain scalability for adaptive rate control, multicasting, and joint source-channel coding
Low-complexity performance scaling to emerging HDTV video formats
Compact SW decoder (for example, such as less than 40 kB in size) can be integrated with each transmitted video stream to enable "self playing" video messages compatible with common handset and PC video players.

The above advantages are achieved by aspects of the present invention including:

Application of wavelet transforms using short dyadic integer filter coefficients in the lifting structure: in certain embodiments the Haar, 2-6, and 5-3 wavelets and variations of them are used. These can require only adds, subtracts, and small fixed shifts—no multiplication or floating-point operations are needed.

Lifting Scheme computation: These filters can be computed using the Lifting Scheme which allows in-place computation. This minimizes use of registers and temporary RAM locations, and keeps references local for highly efficient use of caches.

Wavelet transforms in pyramid form with customized pyramid structure: Certain embodiments of the present invention compute each level of the wavelet transform sequence on half of the data resulting from the previous wavelet level, so that the total computation is almost independent of the number of levels. Aspects of the present invention customize the pyramid to leverage the advantages of the Lifting Scheme above and further economize on register usage and cache memory bandwidth.

Block structure: In contrast to most wavelet compression implementations, aspects of the present invention may divide the picture into rectangular blocks and processes each block separately from the others. This allows memory references to be kept local and to do an entire transform pyramid with data that remains in the processor cache, saving a significant amount of data movement within most processors. The present block structure is particularly helpful in HW embodiments as it avoids the requirement for large intermediate storage capacity in the signal flow.

Block boundary filters: the present invention may also use modified filter computations at the boundaries of each block that avoid, sharp artifacts as set out in U.S. patent application Ser. No. 10/418,363, incorporated herein by reference.

Chroma temporal removal: aspects of the present invention may also avoid processing the chroma-difference signals for every field, instead using a single field of chroma for a GOP as set out in U.S. patent application Ser. No. 10/447,514, incorporated herein by reference.

Temporal compression using 3D wavelets: Certain embodiments of the present invention may not use the very expensive motion-search and motion-compensation operations of conventional video compression methods such as MPEG. Instead those embodiments compute a field-to-field temporal wavelet transform. This is much less expensive to compute. Also sometimes used are short integer filters with the Lifting Scheme in this aspect.

Dyadic quantization: In certain embodiments of the present invention, the quantization step of the compression process may be accomplished using a binary shift operation uniformly over a range of coefficient locations. This avoids the per-sample multiplication or division required by conventional quantization.

Piling: In certain embodiments of the present invention, the amount of data to be handled by the following entropy coder by doing run-of-zeros conversion is reduced. In certain embodiments, the methods and inventions disclosed in U.S. patent application Ser. No. 10/447,455 are utilized for a counting runs of zeros on parallel processing architectures.

Cycle-efficient entropy coding: In certain embodiments of the present invention, the entropy coding step of the compression process is accomplished using techniques that combine the traditional table lookup with direct computation on the input symbol. Because the symbol distribution has been characterized, such simple entropy coders as Rice-Golomb or exp-Golomb or Dyadic Monotonic can be used. The choice of entropy coder details will often vary depending on the processor platform capabilities.

Improved Adaptive Joint Source-Channel Coding

The fine grain scalability of the wavelet-based codec according to aspects of the present invention enables improved adaptive rate control, multicasting, and joint source-channel coding. The reduced computational complexity and higher computational efficiency of the present wavelet algorithms allows information on both instantaneous and predicted channel bandwidth and error conditions to be utilized in all three of the source coder, the channel coder, and the rate controller to maximize control of both the instantaneous and average quality (video rate vs. distortion) of the reconstructed video signal (see FIG. 6). The improved adaptive joint-source channel coding technique of the present invention allows wireless carriers and MMS service providers to offer a greater range of quality-of-service (QoS) performance and pricing levels to their consumer and enterprise customers. Utilizing improved adaptive joint-source channel coding based on algorithms with higher computational efficiency enables support for a much higher level of network heterogeneity, in terms of channel types (wireless and wire line), channel bandwidths, channel noise/error characteristics, user devices, and user services.

Improved Mobile Imaging Handset Platform Architecture

Figure 7:
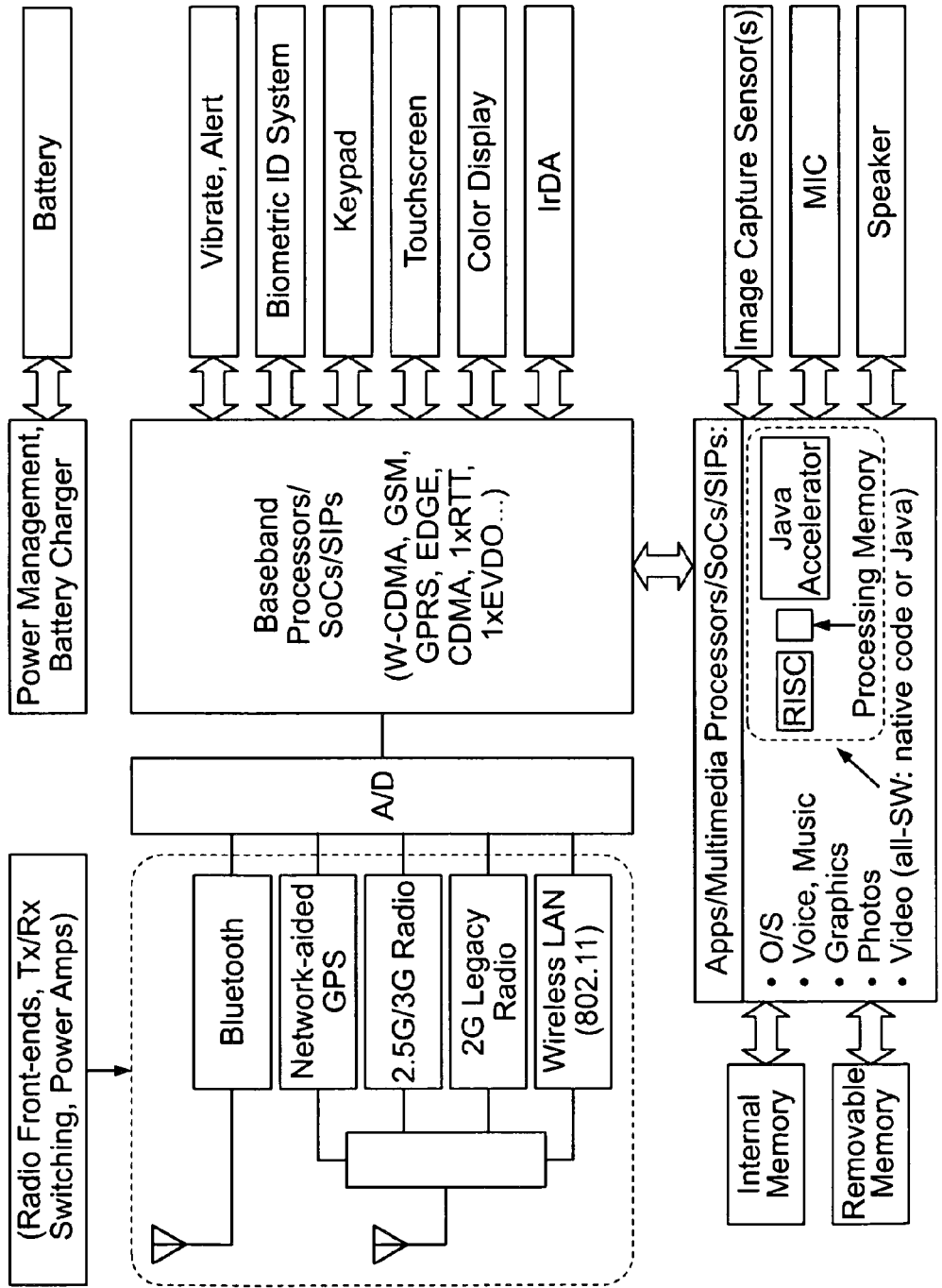
FIG. 7 depicts an improved mobile imaging handset platform architecture.

FIG. 7 illustrates an improved mobile imaging handset platform architecture according to aspects and embodiments of the present invention. The imaging application according to aspects of the present invention is implemented as an all-software application running as native code or as a Java application on a RISC processor. Acceleration of the Java code operation may be implemented within the RISC processor itself, or using a separate Java accelerator IC. Such a Java accelerator may be implemented as a stand-alone IC, or this IC may be integrated with other functions in either a SIP or SoC.

The improved mobile imaging handset platform architecture illustrated in FIG. 7 eliminates the need for separate DSP, ASIC, multimedia processor, or RFD processing blocks for the mobile imaging application, (as would be required in prior devices or systems) and also greatly reduces the buffer memory requirements for image processing in the mobile handset.

Figure 8:
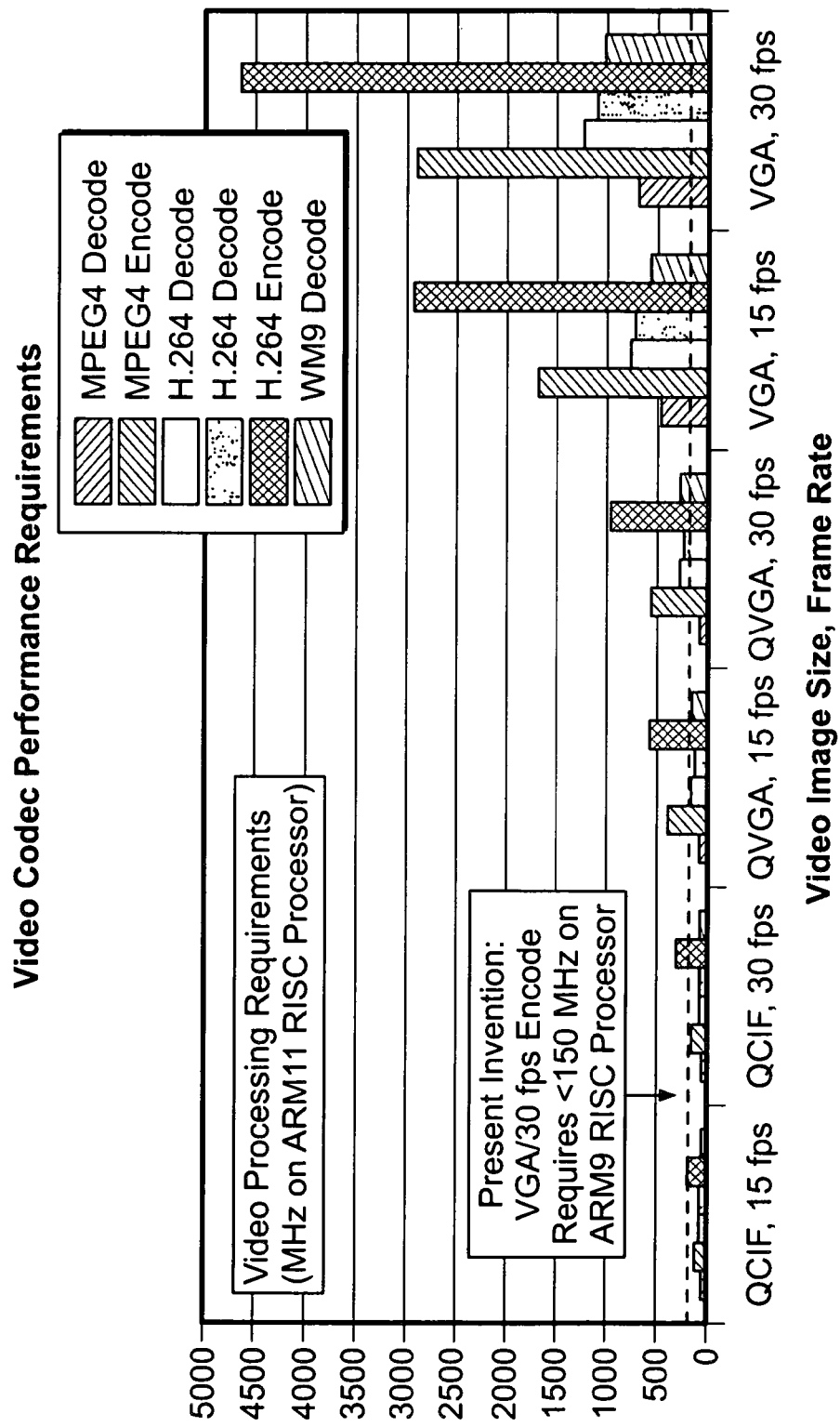
FIG. 8 depicts a Video Codec Performance Comparison.

FIG. 8 shows the reduction in computational requirements for full VGA 30 fps video encoding provided by aspects of the current invention, in comparison to current state-of-the-art industry solutions reached after the filing date of the present application's priority filing based upon MPEG-4 and H-264 video codecs.

Figure 9:
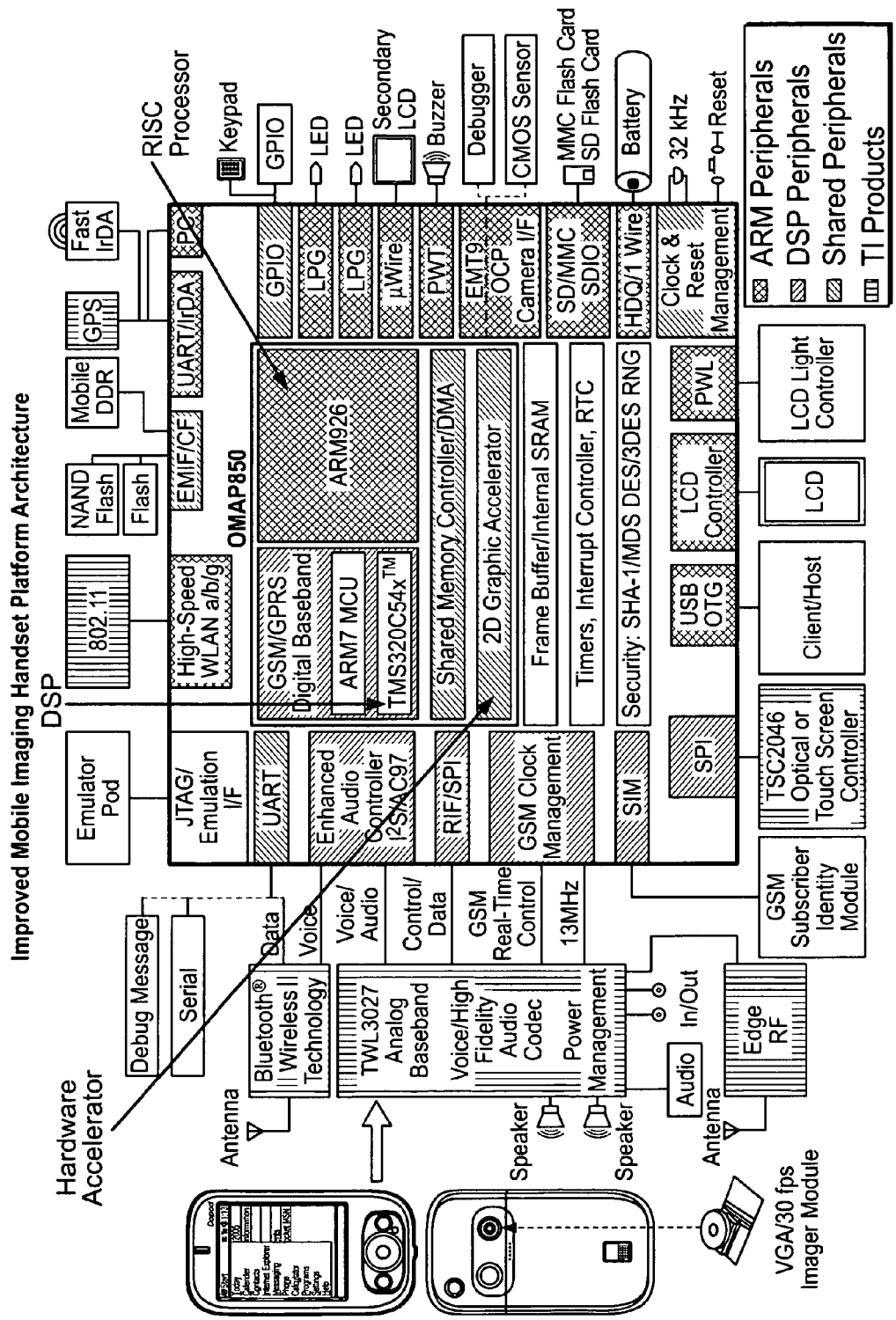
FIG. 9 depicts an improved mobile imaging handset platform architecture.

FIG. 9 shows one implementation of aspects of the current invention on a commercial mobile GSM camcorder phone platform. Whereas the existing GSM baseband/multimedia SoC (Texas Instruments OMAP 850 shown in FIG. 9) requires a HW accelerator, a DSP, and a RISC processor for QCIF/15 fps camcorder functionality, the present invention provides VGA/30 fps camcorder functionality on this platform using only SW running on the RISC processor without the need of a 11W accelerator or a DSP.

Figure 10:
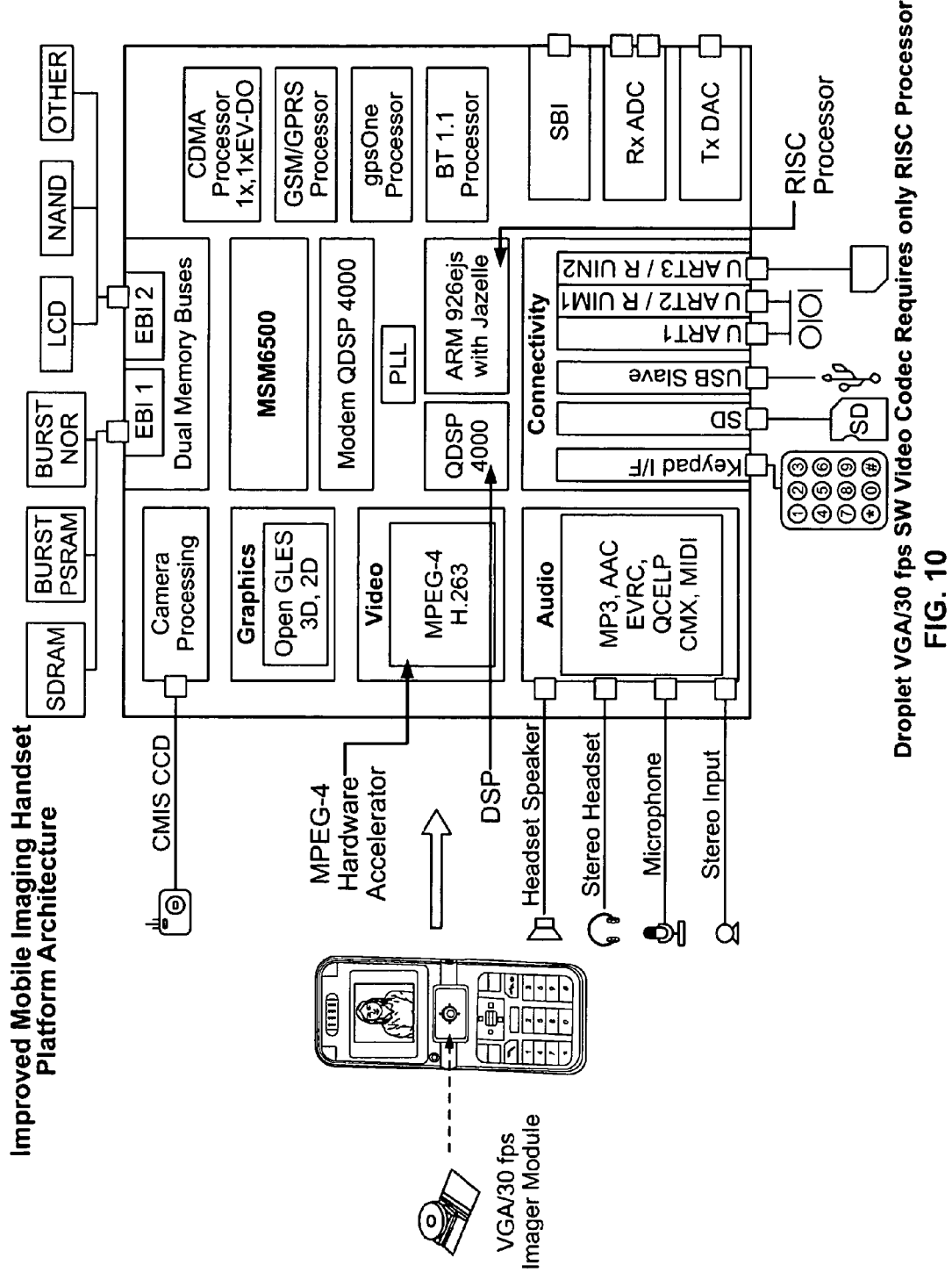
FIG. 10 depicts an improved mobile imaging handset platform architecture.

FIG. 10 shows one implementation of aspects of the current invention on a commercial mobile CDMA camcorder phone platform. Whereas the existing CDMA baseband/multimedia SoC (Qualcomm MSM6500 shown in FIG. 10) requires a HW accelerator, a DSP, and a RISC processor for QCIF/15 fps camcorder functionality, the present invention provides VGA/30 fps camcorder functionality on this platform using only SW running on the RISC processor without the HW accelerator or DSP.

Improved Mobile Imaging Service Platform Architecture

Figure 11:
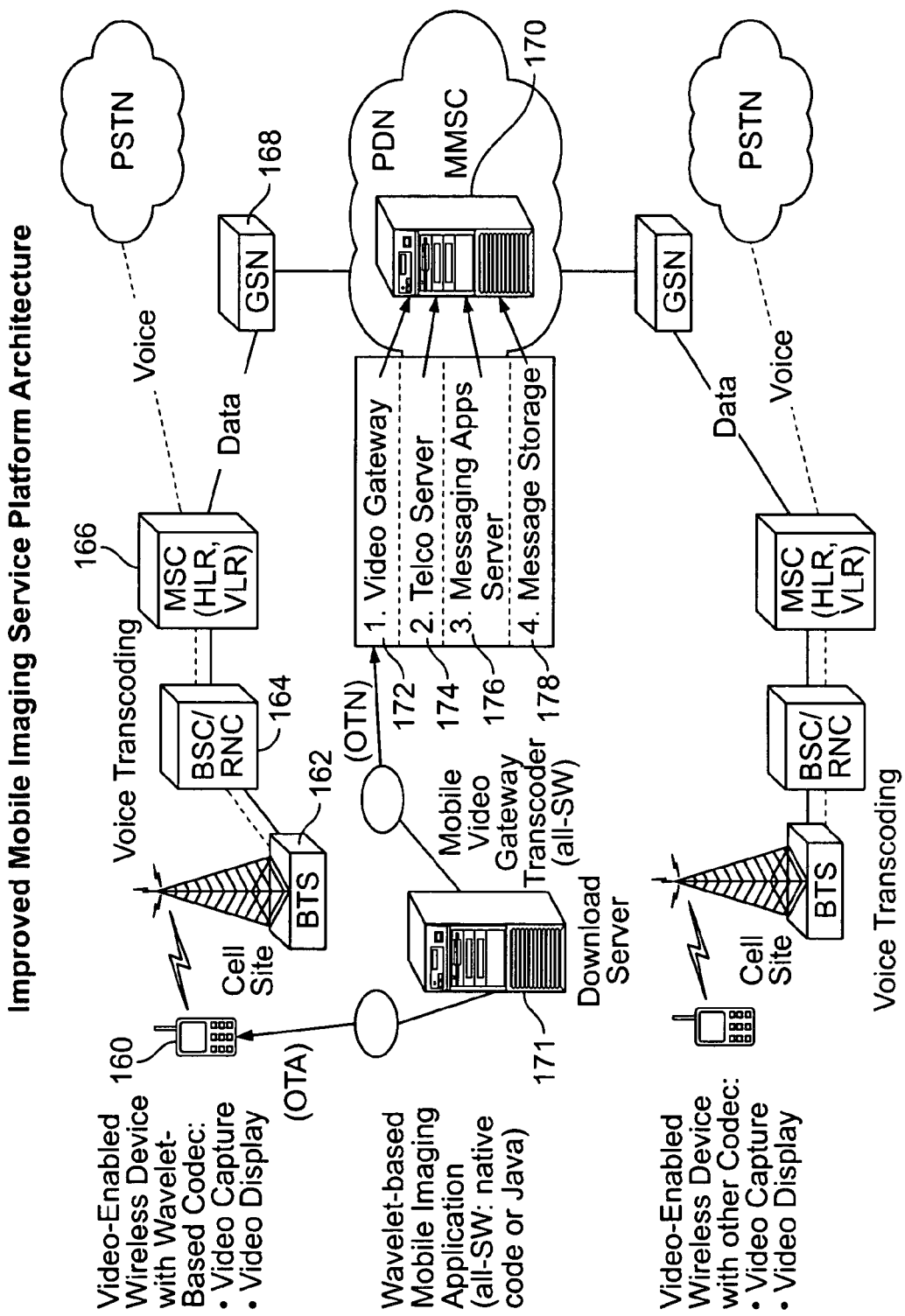
FIG. 11 depicts an improved mobile imaging service platform architecture.

Components of an improved mobile imaging service platform architecture according to embodiments of the present invention (see FIG. 11) may include:

Mobile Handsets 160

Mobile Base stations (BTS) 162

Base station Controller/Radio Network Controller (BSC/RNC) 164

Mobile Switching Center (MSC) 166

Gateway Service Node (GSN) 168

Mobile Multimedia Service Controller (MMSC) 170

Imaging Service Download Server 171

Typical functions included in the MMSC (see FIG. 11) may include:

Video Gateway 172

Telco Server 174

MMS Applications server 176

Storage Server 178

According to aspects of certain embodiments of the present invention, certain steps involved in deploying the improved imaging service platform may include:

Step 1.

Signal network that Video Gateway Transcoder application and/or video messaging/sharing applications are available for updating deployed MMSCs. The update can be installed via automated OTN deployment or via manual procedures.

Step 2.

Figure 12:
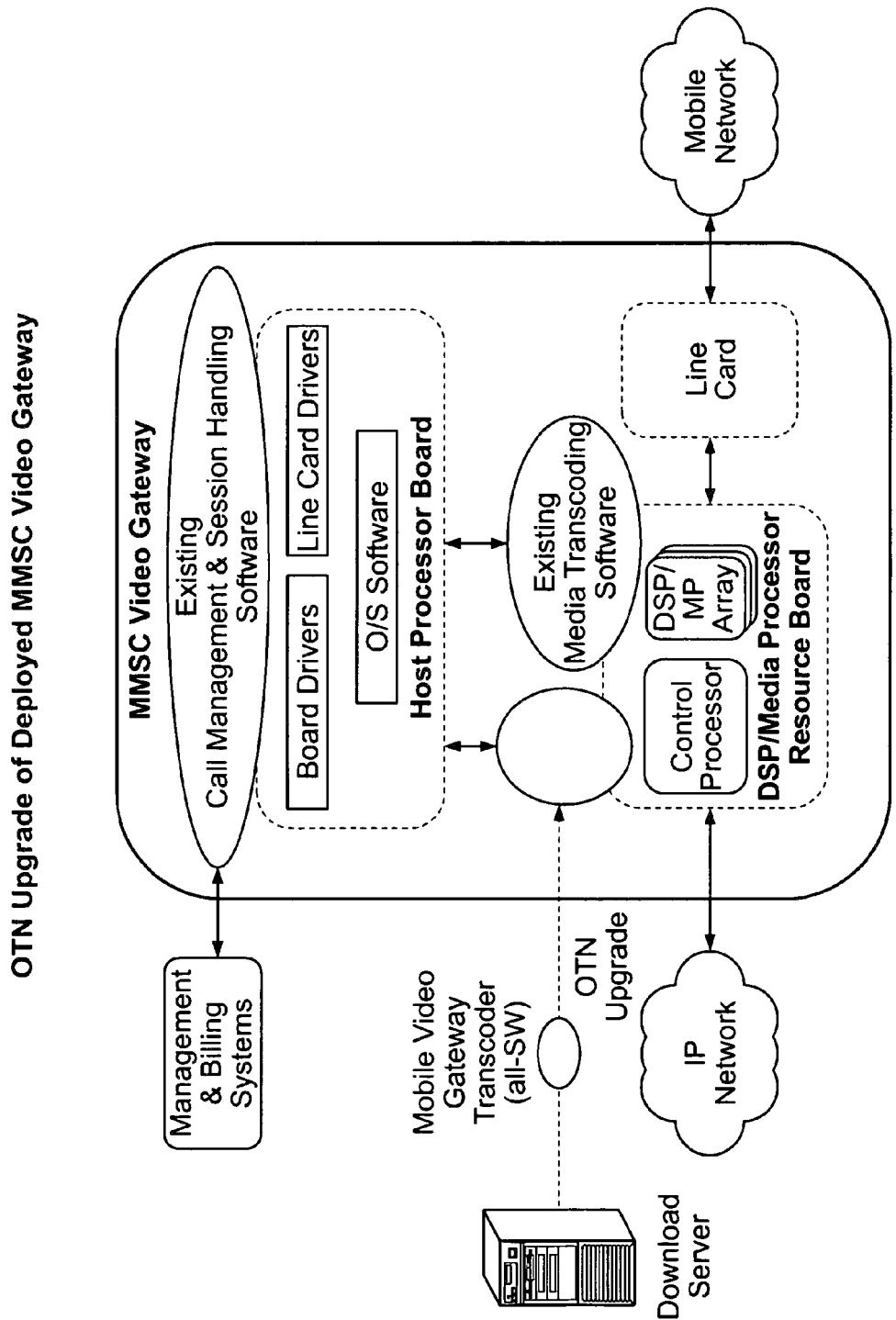
FIG. 12 depicts an OTN Upgrade of deployed MMSC Video Gateway.

Install and configure Video Gateway Transcoder SW application and/or video messaging/sharing SW applications via automated OTN deployment or via manual procedures (see FIG. 12).

Step 3.

Signal subscriber handset that Mobile Video Imaging Application is available for download and installation.

Step 4.

If accepted by subscriber, and transaction settlement is completed successfully, download and install Mobile Video Imaging Application.

Step 5.

Signal network that handset upgrade is complete. Activate service and related applications. Update subscriber monthly billing records to reflect new charges for Mobile Video Imaging Application.

Figure 13:
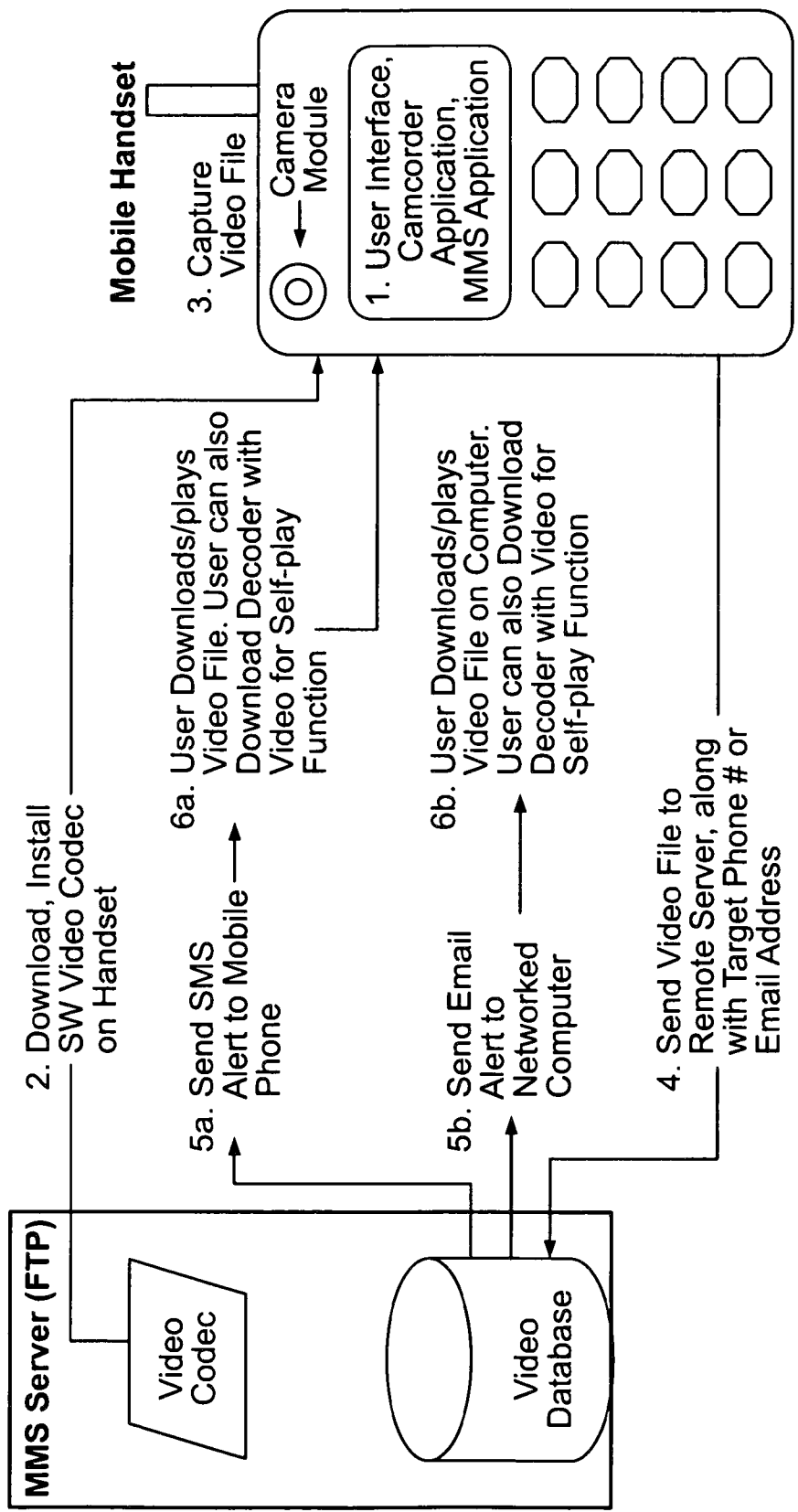
FIG. 13 depicts a Self-playing video MMS eliminates need for transcoding.

According to certain aspects of the present invention, FIG. 13 shows "self-playing" video MMS functionality achieved by integrating the SW decoder with the transmitted video stream.

Figure 14:
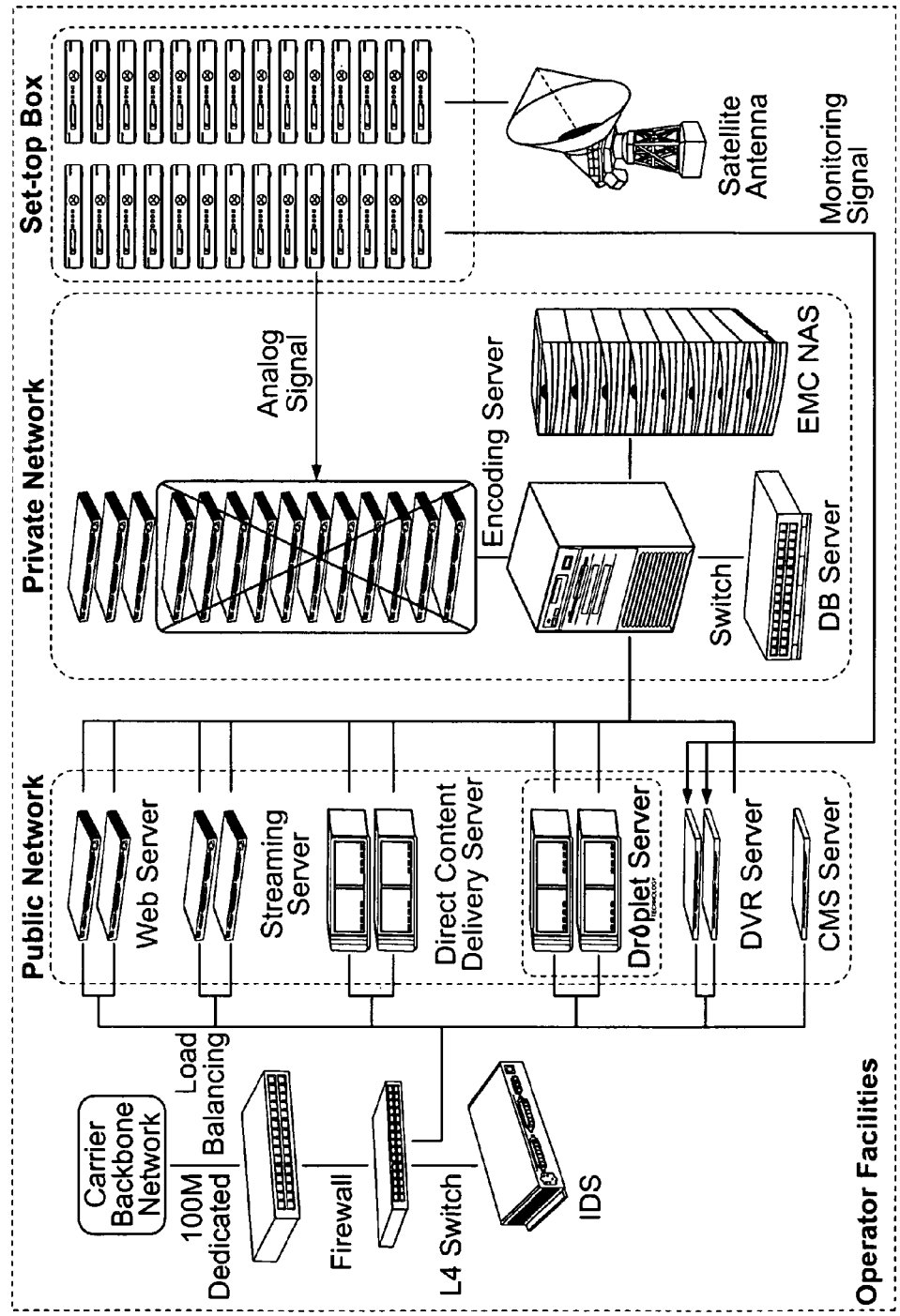
FIG. 14 depicts a reduction in complexity, cost, and number of video editing servers are to deploy media producer services.

According to certain aspects of the present invention, FIG. 14 shows the reduction in complexity, cost, and number of video application servers required to deploy media producer services such as automated or manual editing of user-created video, as well as database storage, search, and retrieval of user-created video.

Figure 15:
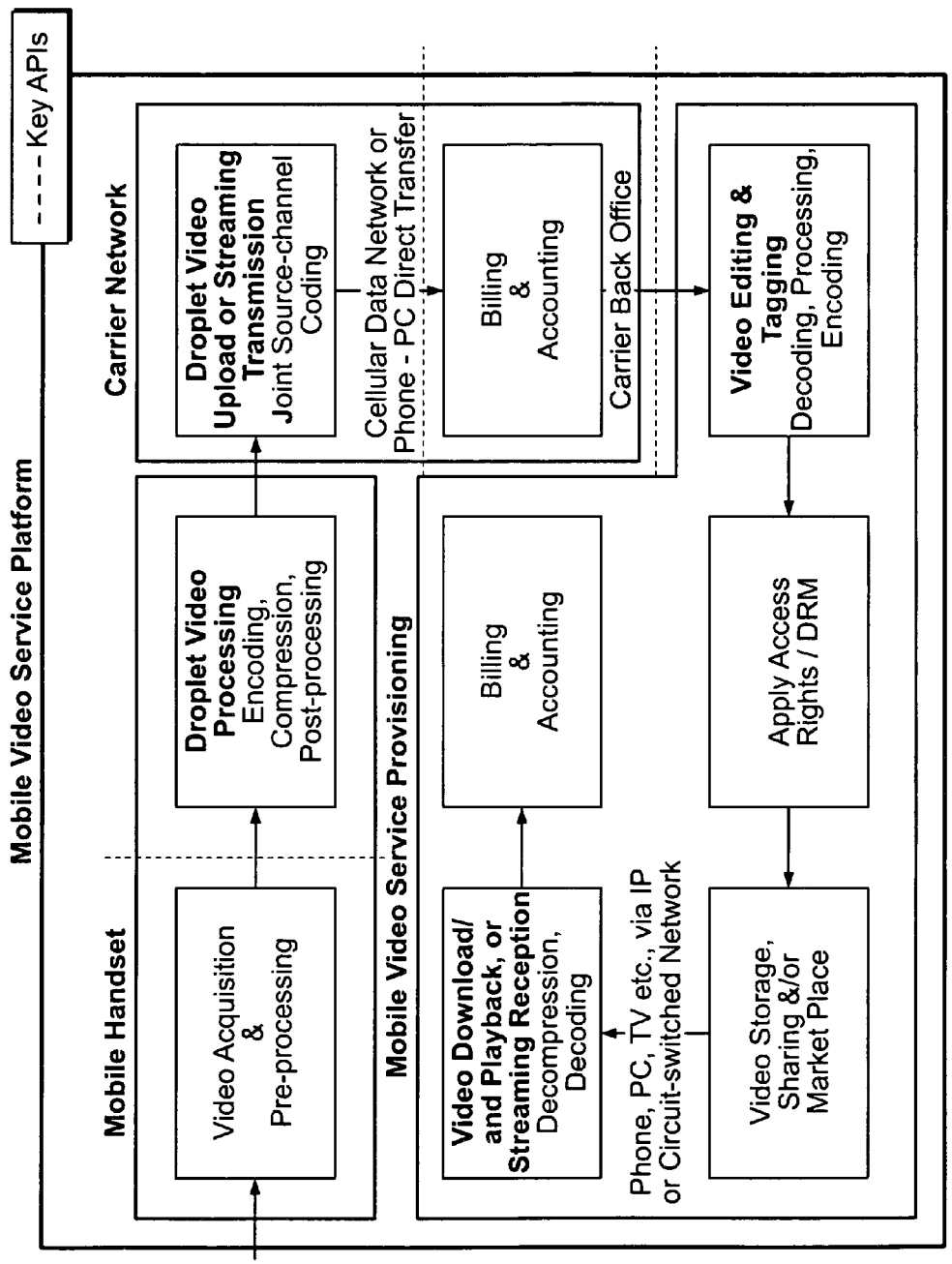
FIG. 15 depicts a mobile video service platform.

According to certain aspects of the present invention, FIG. 15 shows the functional elements of a video messaging/sharing/calling platform incorporating the improved wavelet-based codec/camcorder application, improved joint source channel coding, and improved video editing and database storage, search, and retrieval.

Figure 16:
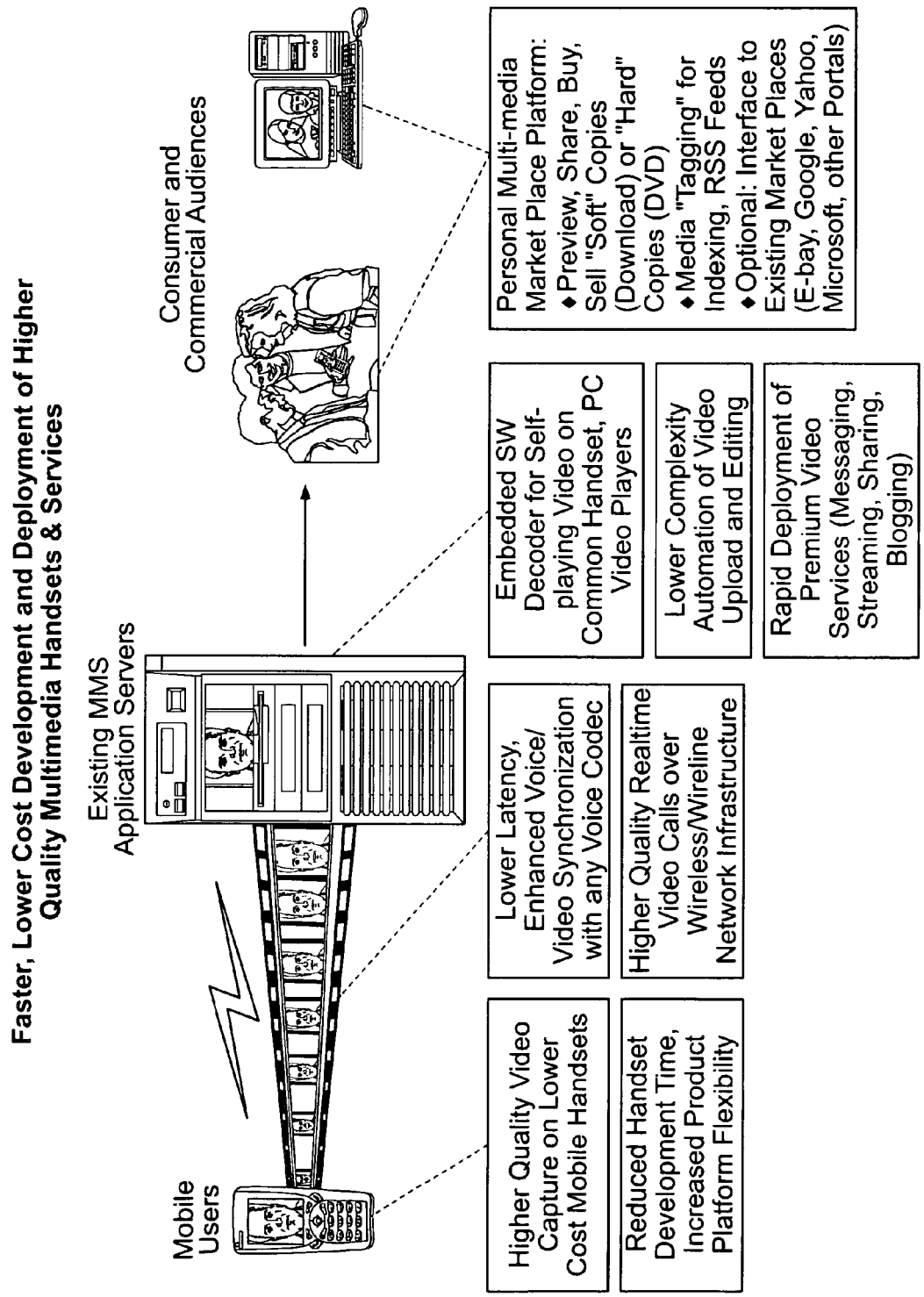
FIG. 16 depicts faster, lower cost development and deployment of higher quality multimedia services.

According to certain aspects of the present invention, FIG. 16 shows the benefits in terms of faster, lower cost development and deployment of higher quality multimedia handsets & services, including the ability to deploy an innovative personal multi-media market place platform in which users can preview, share, buy, and sell "soft" copies (download) or "hard" copies (DVD) of user-created audio/video content. The present invention also allows for more efficient video "tagging" for database indexing and network (RSS) feeds, and supports interfaces to existing web-based market places such as E-bay, Google, Yahoo, Microsoft, and other portals.

Figure 17:
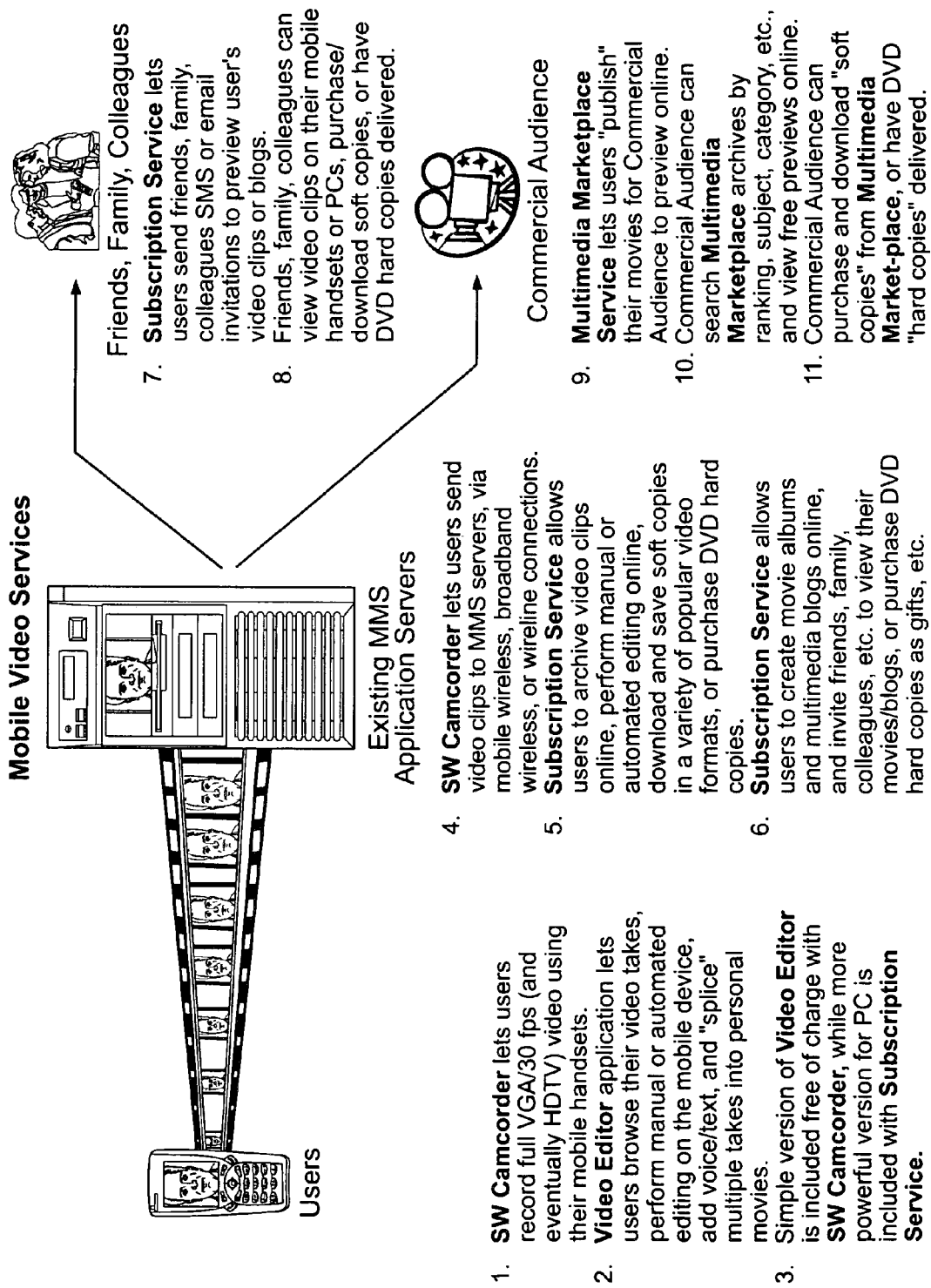
FIG. 17 depicts aspects of mobile video services according to aspects of the present invention.

According to certain aspects of the present invention, FIG. 17 shows several innovative new mobile video services based on the improved wavelet-based codec/camcorder application, improved joint source channel coding, and improved video editing and database storage, search, and retrieval.

Figure 18:
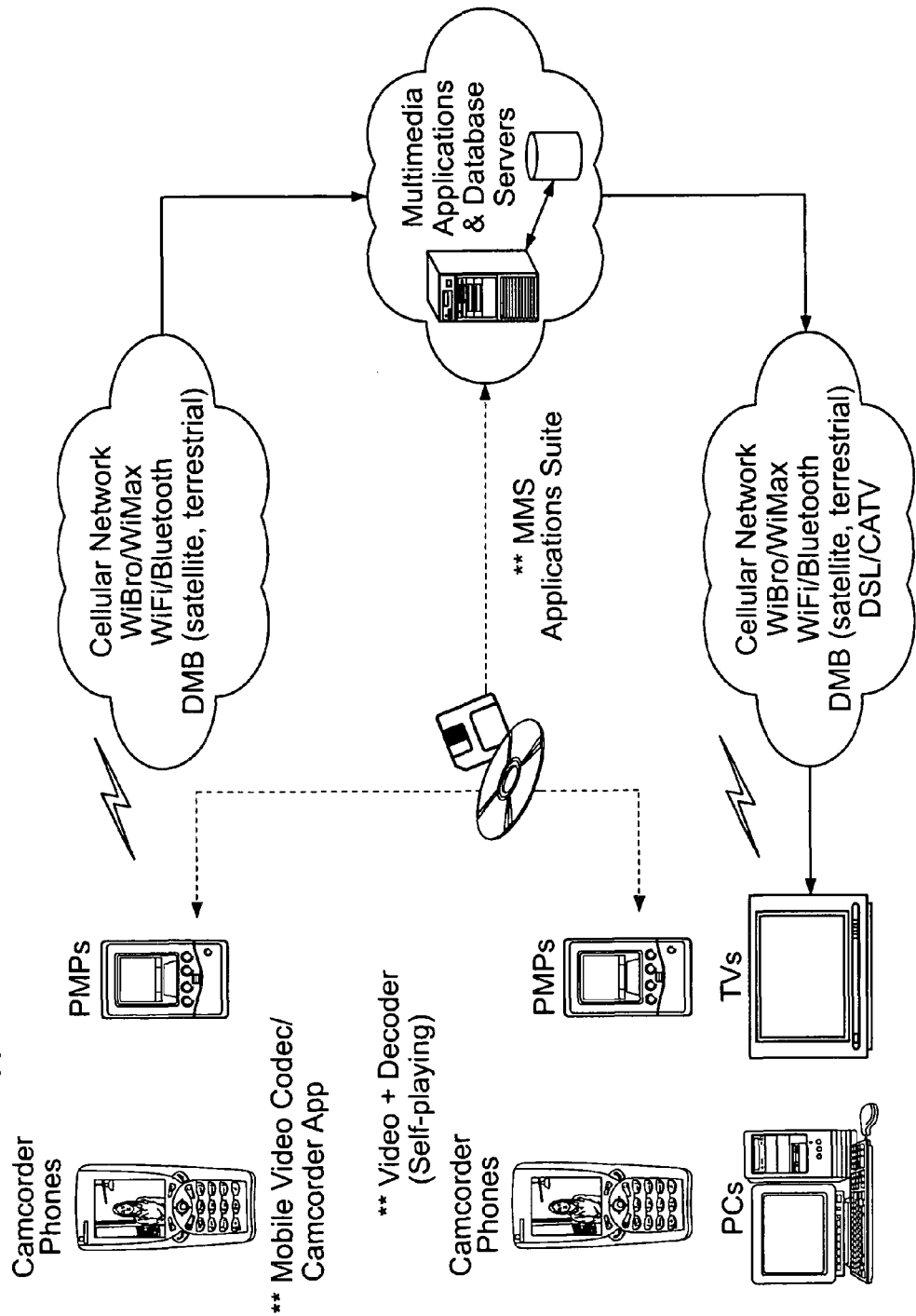
FIG. 18 depicts Applications to Broadband Multimedia Devices and Services according to aspects of the present invention.

According to certain aspects of the present invention, FIG. 18 shows applications of the above video messaging/sharing/calling platform incorporating the improved wavelet-based codec/camcorder application, improved joint source channel coding, and improved video editing and database storage, search, and retrieval, to deploy new video services on fixed wireless, mobile wireless, and wireline networks, as well as "converged" networks combining elements of fixed wireless, mobile wireless, and wireline architectures.

Performance

Aspects of the present invention, with their improved wavelet-based mobile video imaging application, joint source-channel coding, handset architecture, and service platform architecture achieve goals of higher mobile video image quality, lower handset cost and complexity, and reduced service deployment costs.

Various Embodiments

Figure 19:
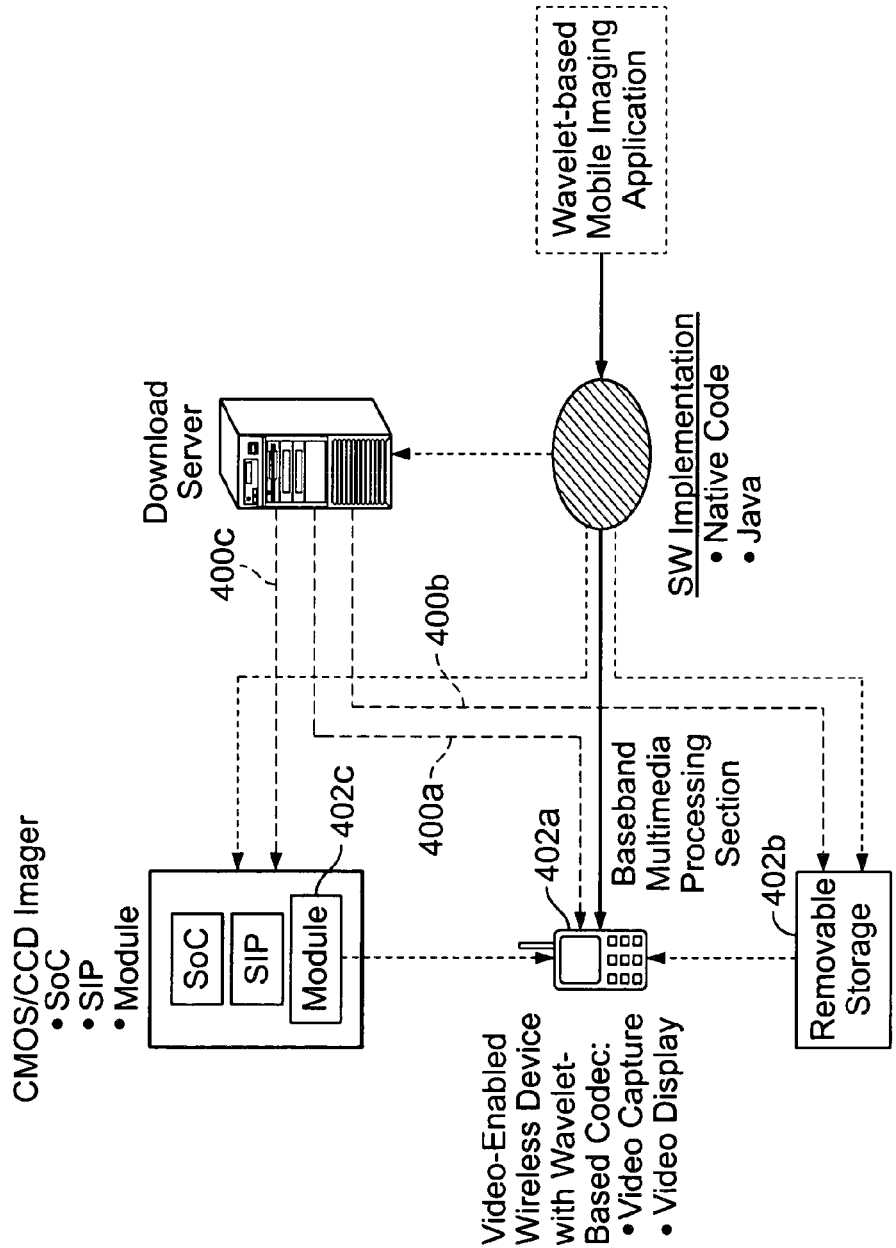
FIG. 19 depicts Implementation Options for SW Imaging Application according to aspects of the present invention.

Various embodiments of aspects of the present invention provide enhancements to the mobile imaging handset architecture. For example, several implementation options can be considered for the all-SW wavelet-based imaging application (see FIG. 19). The imaging application can be installed via OTA download (400a, 400b, 400c) to the baseband multimedia processing section of the handset 402a, to a removable storage device 402b, or to the imaging module 402c. Where desirable, the imaging application can also be installed during manufacturing or at point-of-sale to the baseband multimedia processing section of the handset, to a removable storage device, or to the imaging module. Additional implementation options are also possible as mobile device architectures evolve.

Figure 20:
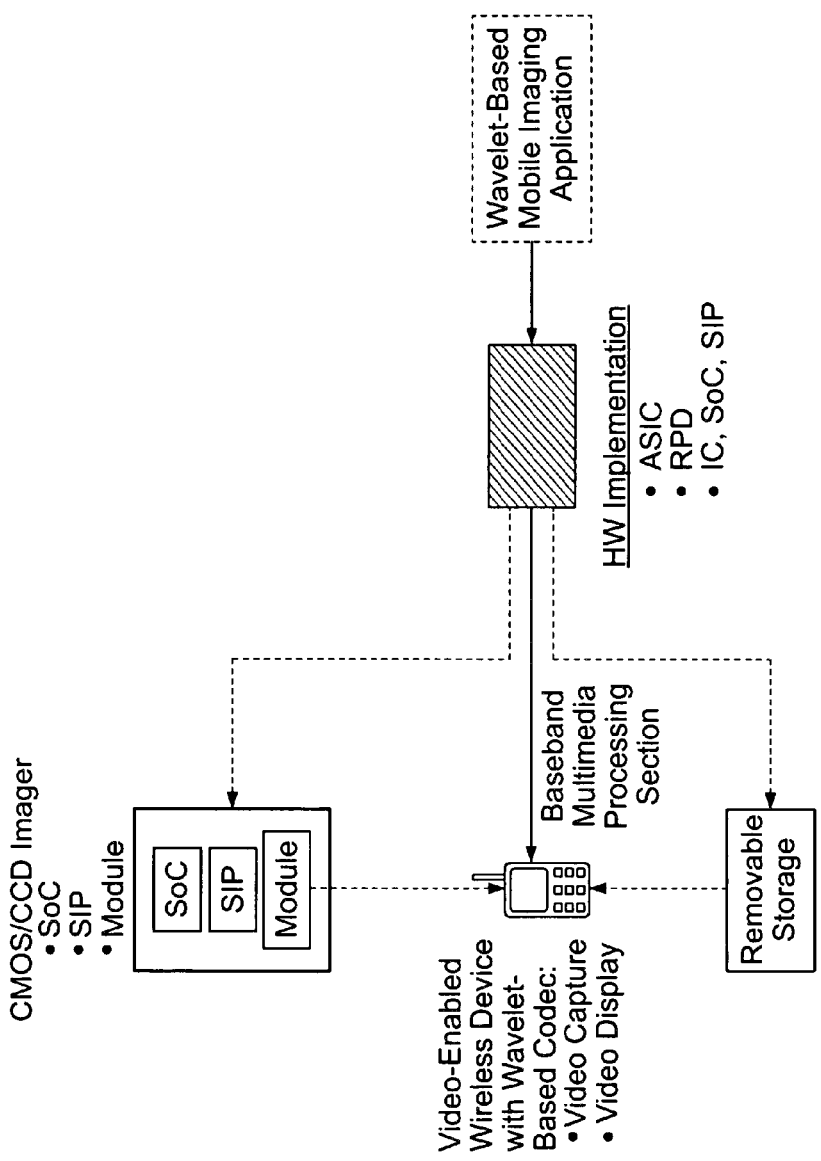
FIG. 20 depicts Implementation Options for HW-Accelerated Imaging Application according to aspects of the present invention.

According to aspects of the present invention, performance of the mobile imaging handset may be further improved, and costs and power consumption may be further reduced, by accelerating some computational elements via HW-based processing resources in order to take advantage of ongoing advances in mobile device computational HW (ASIC, DSP, multimedia processor, RPD) and integration technologies (SoC, SIP). Several all-HW options can be implemented for integrating these hardware-based processing resources in the handset (see FIG. 20), including the baseband multimedia processing section of the handset, a removable storage device, or the imaging module.

Figure 21:
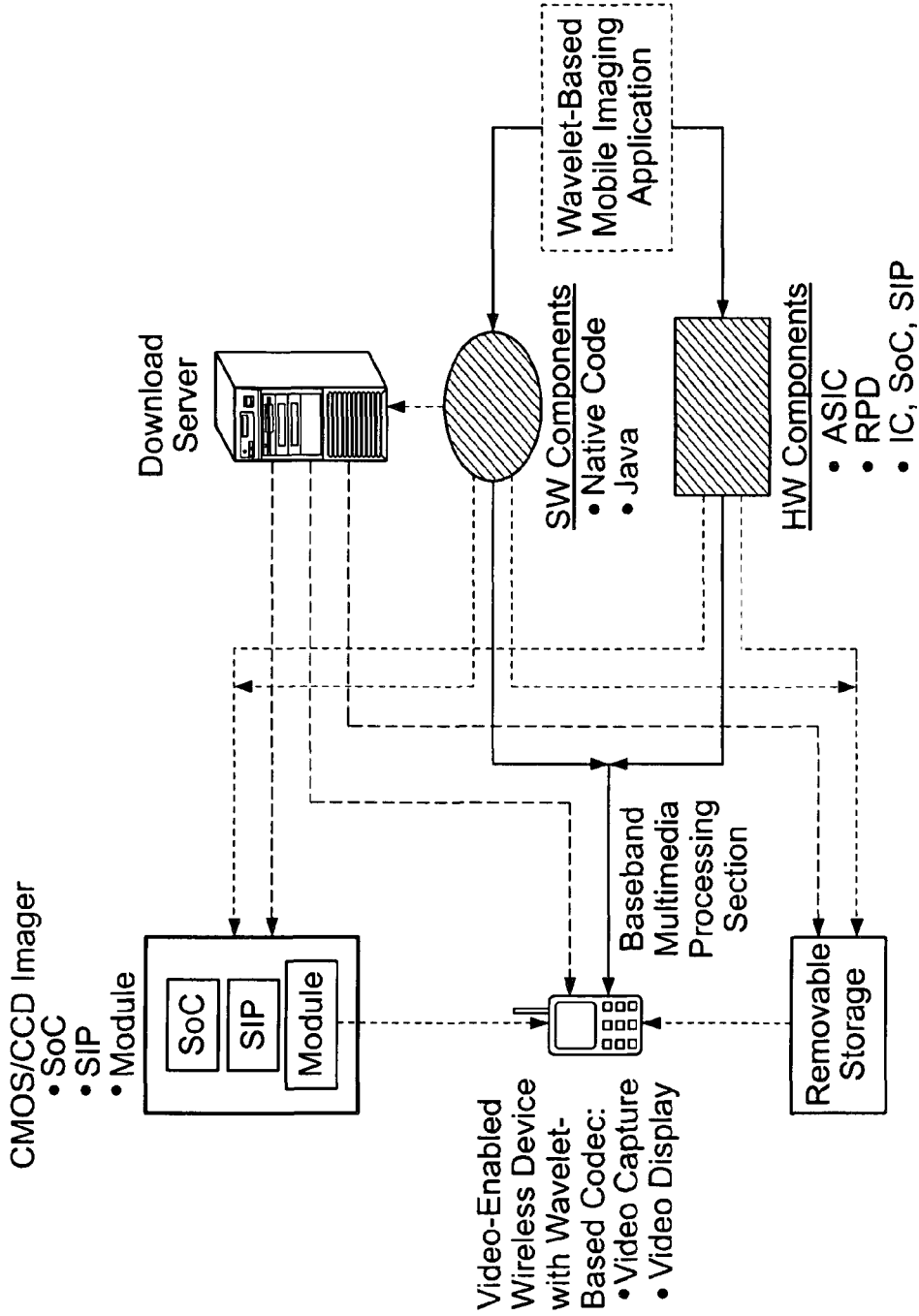
FIG. 21 depicts Implementation Options for Hybrid HW-Accelerated SW Imaging Application according to aspects of the present invention.

As shown in FIG. 21, hybrid architectures offered by aspects of the present invention for the imaging application may offer enhancements by implementing some computationally intensive, repetitive, fixed functions in HW, and implementing in SW those functions for which post-manufacturing modification may be desirable or required.

Figure 22:
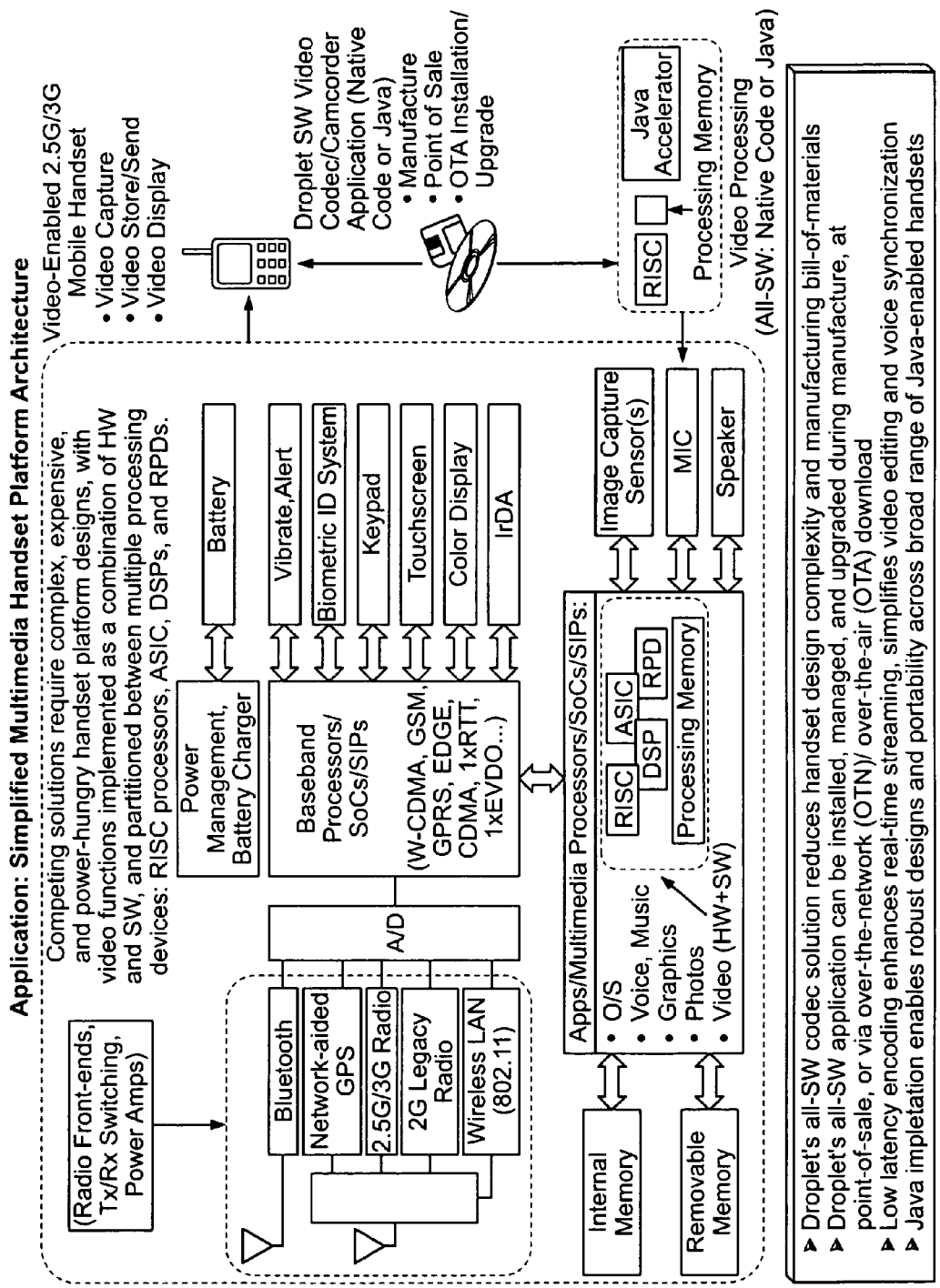
FIG. 22 depicts an Application: Simplified Multimedia Handset Platform Architecture.

According to aspects of the current invention, FIG. 22 shows potential simplifications in mobile camcorder device architecture, deployment, and maintenance.

Advantages

The all-SW imaging solution of the present invention substantially reduces baseband processor and video accelerator costs and requirements in multimedia handsets. Combined with the ability to install and maintain the codec post-production via OTA download, this all-SW solution can substantially reduce the complexity, risk, and cost of both handset development and video messaging service deployment.

The present invention provides mobile operators with the first mobile video messaging and sharing platform that delivers the video quality, mobile handset price-point, and service deployment costs required for mass-market adoption by consumer and enterprise customers. The present invention provides the first all-SW camcorder phone application capable of real-time capture of full (VGA)-size images (640×480 pixels) at 30 frames per second (fps), using only according to certain aspects and embodiments of the present invention standard RISC processors already incorporated in the vast majority of multimedia handsets. For mobile carriers, the present invention's low-complexity video processing and distribution technologies can be integrated into a powerful new all-software platform that enables turnkey deployment using existing mobile handsets and mobile Multimedia Messaging Service (MMS) infrastructure. Complementing the above all-SW mobile camcorder application, aspects of the present invention's content management platform provide carriers with modules for integrating compressed images and videos, according to the present technology, together with sounds and text into complete mobile multimedia messages and "ringtones", along with on-the-fly editing, thumbnail previews, multimedia mailboxes, on-line repository, sharing, and marketing services, and subscription management.

Example 1, below, describes the components, setup, and operation of an introductory demonstration of the functionality and benefits provided by an embodiment of aspects of the present invention's software-only mobile video messaging platform. The demo utilizes commercially available GSM/GPRS multimedia handsets, and was designed to operate over any commercial GSM/GPRS network. The demonstration operated very successfully. The demo can also be readily adapted to utilize CDMA handsets, and to operate over any commercial CDMA network. The demo in Example 1 runs a demo and set of files code named "Droplet" and so labeled in Example 1.

EXAMPLE 1

Figure 23:
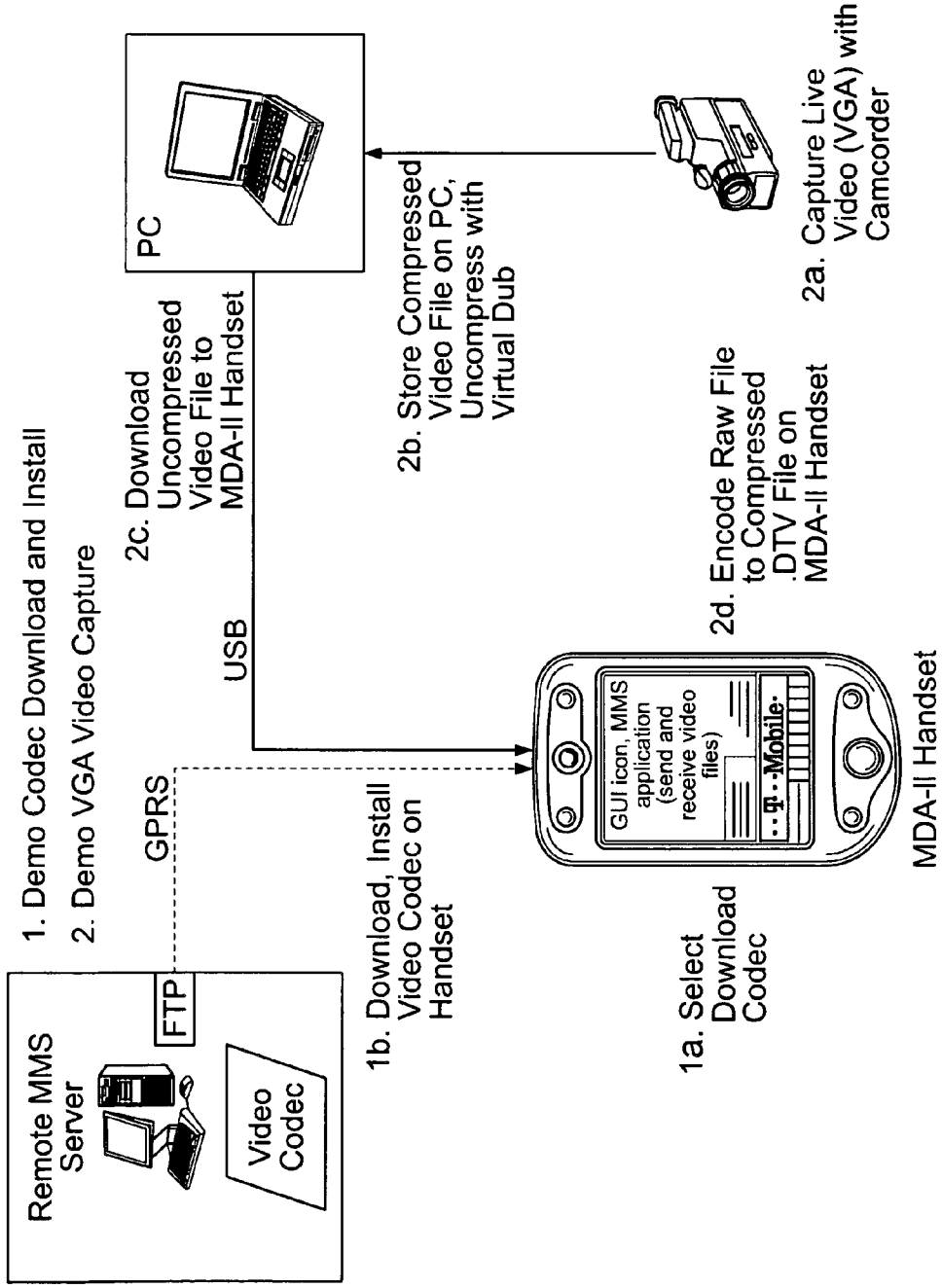
FIG. 23 depicts Elements of the mobile video messaging demo over a GSM/GPRS network.
Figure 24:
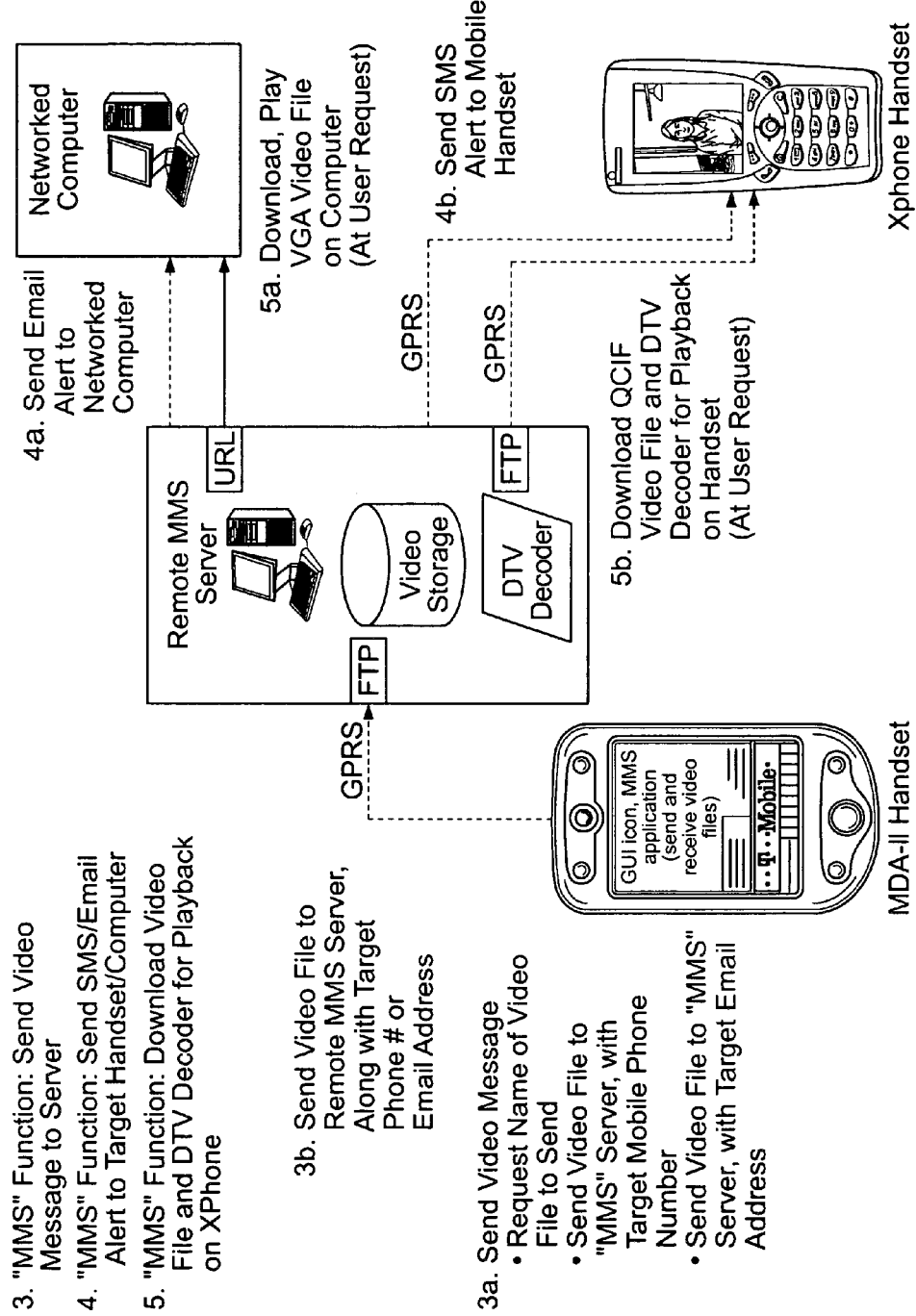
FIG. 24 depicts certain MMS functionality according to aspects of the present invention.

As illustrated in FIGS. 23 and 24, the demo includes the following five elements:
 1. Downloading the present invention's all-SW "DTV" video codec application over-the-air (OTA) from an MMS service provider's server, and installing in a multimedia handset.
 2. Using the DTV video codec to compress high-quality (VGA, 30 fps) video messages in the multimedia handset
 3. Sending the compressed video messages (the present invention's DTV format) to an MMS server, either in full VGA/30 fps resolution for forwarding/playback on a computerfTV, or scaled down to lower resolution (QCIF/15 fps) for forwarding/playback on another multimedia handset.
 4. Notification by the MMS server, via an email alert to a networked computer or an SMS alert to another handset, that the compressed video images are available for download.
 5. Downloading the compressed video messages, together with the present invention's DTV decoder, for "self-playing" function, i.e. decoding on a networked computer (VGA/30 fps) or on another handset (QCIF/15 fps) and playback using common video players already installed on the PC or handset.

Equipment Used for the Video Messaging Demo 2.1 Handsets

For the version of the demo described in this Example 1, the two commercially available GSM/GPRS multimedia handsets described below are used. Many other comparable multimedia handsets can also be utilized.

2.1.1 T-Mobile MDA-II PDA-Phone (Manufactured by HTC)
- Needs to be operational on a local GSM/GPRS network
- Data/internet access service should be activated
- MDA-II phone cradle with USB 2.0 cable to connect the handset to a PC
- OS: Windows Mobile 2003 Pocket PC with Phone Edition 2.1.2 O2 Xphone Smartphone (Manufactured by HTC)
- Needs to be operational on a local GSM/GPRS network
- Data/internet access service should be activated
- USB 2.0 cable to connect the handset to a PC
- OS: Windows Mobile 2003 Smartphone Edition 2.2 Computers 2.2.1. PC (Laptop or Desktop)

For the version of the demo described in Example 1, a laptop computer is utilized, with the following configuration:
- Model: Sony Vaio PCG-K33P
- Processor/Memory: 3.06 GHz Pentium 4, 512 MB RAM
- Graphics: ATI Radeon IGP 345M with 64 MB RAM
- Storage: 60 GB
- I/O: one 1394 (Firewire) port, two USB 2.0 ports
- OS: Windows XP
- Pre-installed video application: Windows Movie Maker 2.2.2. Remote Server For the version of the demo described in Example 1, a UNIX-based remote server is used to perform the following MMS functions:
- Store DTV codec for download by MDA-II handset
- Store DTV player application for download by Xphone
- Receive compressed video messages from MDA-II handset for storage/forwarding
- Send SMS message notifying Xphone that video message is available for download
- Enable Xphone to access (via browser) both the DTV player application and QCIF/15 fps video messages for download 2.3 Video Capture For the version of the demo described in Example 1, the following commercial camcorder is utilized to provide an external source of high-quality video input sequences for compression by the present invention's DTV codec running on the handsets:
- Canon ZR65 DV Camcorder (with 1394 Firewire cable to connect camcorder to PV)

Use of the external camcorder, rather than the much lower performance imager modules currently available in most commercial camcorder phones, enables a much more compelling demonstration of the benefits of the present invention's DTV codec and mobile video messaging capabilities.

The compressed DV video files captured by the camcorder are first converted into decompressed UYVY video format in the PC, and then input to the MDA-II handset for encoding/compression by the present invention's DTV codec. UYVY is a typical video format that would be input to the video codec in a multimedia handset.

Equipment Setup/Configuration for Demo 3.1 Configuring the PC 3.1.1 Downloading the Droplet Demo Package according to aspects of the present invention
- Open the URL http://droplet-tech.com/demopartner_access.html in the PC's web browser.
- Select the link "Demo Package—January 2005" (WinZip archive).
- Click on this link to start downloading the demo package to the PC.
- Place the zip file into a folder of your choosing
- Unzip the file and you should see the following:
    - Demo package "read me" document (Demo_package_readme.html)
    - The following directories:
        - MDA_DTV: MDA-II client UI applications
        - Xphone_DTV: Xphone UI client applications
        - PC_player: files for playing DTV files on the PC
        - Virtual_Dub1.6.3: PC software app for converting between different video Formats
        - MMS_server: sample monitoring script for the server
        - Canon_driver: camcorder driver software
        - PHMRegEditor: Registry editor for installation on MDA-II and Xphone
        - Ewesoft: JVM for the Xphone 3.1.2 Downloading the J9 JVM (Java Virtual Machine) Installation Package
- Open the URL http://droplet-tech.com/ftp_access.html in the PC's web browser.
- Select the link "J9_JVM" (WinZip archive).
- Click on this link to start downloading the J9 JVM package to the PC.
- Put the zip file "weme57prod_pp_wm__1.zip" into a folder of your choosing.

3.1.3 Downloading and Installing DirectX 9.0 SDK (Utilized by DTV PC Player)
- This free SDK can be downloaded from the Microsoft website:
- http://msdn.microsoft.com/library/default.asp?url=/downloads/list/directx.asp
- Note that this is a very large download (~230 MB)
- Launch DirectX Utilities→GraphEdit function to verify successful installation.

3.1.4 Installing the Present Invention's Droplet DTV PC Player on PC
- The software package can be found in the demo package under the PC_player directory. The file is called PC_player.zip.
- Unzip the package to the "C:" drive on the test PC as the folder "C:\DTV_PCplayer_Demo\". If the actual path is different, edit RegisterFilter.bat and UnRegisterFilter.bat.
- Open the folder and register the DirectShow filter by double-clicking the batch file "RegisterFilter.bat".

3.1.5 Downloading and Installing Virtual Dub on PC

In the present version of the demo, Virtual Dub is used to convert the compressed DV video files, as captured by the camcorder, into decompressed UYVY video format in the PC. These decompressed video files are then input to the MDA-II handset for encoding/compression by the present invention's DTV codec. UYVY is a typical video format that would be input to the video codec in a multimedia handset.
- The software package is found in the demo package under the Virtual_Dub directory.
- Alternatively, the software package can also be found at the following URL: http://jaist.dl.sourceforge.net/sourceforge/virtualdub/VirtualDub-1.6.3.zip
- In the Virtual_Dub directory is a file called VirtualDub.exe. This is selected and the application is verified to run.

3.1.6 Installation of the Canon ZR65 Camcorder Driver on PC
- The Canon_driver package is found in the demo package under the Canon_driver directory.
- Alternatively, the driver can also be found at http://www.canon.com.
- The Canon driver directory is opened and the subfolder "ZR65W1503EN" then subfolder "English" are selected and then the "SETUP.EXE" executable program is run to install the Canon camcorder driver.

Note: If another type of camcorder is used, the appropriate driver must be installed on the PC. The camcorder must be capable of DV video capture while connected to the PC.

3.2 Configuring the Remote MMS Server

In the demo, the remote MMS server functions both as an FTP server (to enable download of video codec files to the handsets, and network storage of video files from the recording handset), and as a mail server (to enable email/SMS notification and download of video messages by networked computers and other handsets). Functionally, the server must be able to send SMS messages, in order to enable SMS notification to other handsets of pending video messages.

Configure the FTP site to have the following directories:
public_html

Pre-install the DTV codec (file DtvMDADemo.exe) on the server, for subsequent download by the MDA-II handset. This file should be transferred in binary mode to the FTP server at the top level.

Pre-install the DTV decoder (file DtvXphoneDemo.exe) on the server, for subsequent download by the Xphone. This file should be transferred in binary mode to the FTP server at the top level.

A sample monitoring script is in the Droplet demo package under the MMS_server directory (filename: monitor.php).

This monitoring script is referenced in crontab on Unix based servers. This script will monitor every minute for the presence of new files (ending in ink) in the ftp:/public_html directory.

If the user chooses to use the above sample monitoring script on a server other than the Droplet demo server, it must be customized for the local server/network environment.

3.3 Configuring the MDA-II

Connect the MDA-II to the PC (pre-configured as described in Section 3.1) via the cradle/USB cable.

3.3.1 Modifying the Registry Entries for Stable GPRS Connection

To ensure a stable GPRS connection, the timeout period is increased to greater than the default setting of 60 sec. The handset manufacturer (HTC) has provided the recommended registry changes. If there is no Registry Editor installed on the device, first install the registry editor included in Droplet's Demo package under the "PHMRegEditor" directory.

Place the file PHMRegEdit.msi in the Temp directory on your PC

Place the CAB files regedit.Mrln_ARM.CAB in the same directory on the PC

Run PHMRegEdit.msi by double-clicking on it and follow the instructions

Synchronize with the MDA-II

Copy the file regedit.Mrln_ARM.CAB to the Windows directory on the MDA-II

Double-click on that file in the MDA-II and it will install the CAB files appropriately Run PHMRegEdit.msi and follow the instructions.

The resulting program PHMEditor is installed on the MDA-II in the directory \Program Files\PHM Tools Start the program regedit (the registry editor) from the above directory Select
HKEY_LOCAL_MACHINE\SOFTWARE\
Microsoft\ConnMgr\Planner\Settings Change the setting for CacheTime to 300 (this is 5 min. timeout period)

Change the setting for Suspend Resume to ~GPRS! (allows for no timeout)

Exit the registry editor.

Perform a soft reset to allow the modified settings to take effect 3.3.2 Installing IBM J9 JVM Unzip the "weme57prod_pp_wm__1.zip" file that was previously downloaded on the PC (Section 3.1.2). There are 5 files.

inst_pp_wm.html
readme_pp_wm.html
weme-wm2003-arm-ppro10-5.7.1-P-20040723-1833.bin
weme-wm2003-arm-ppro10-5.7.1-P-20040723-1833.exe
weme57_ppc_pp__1.pdf Open file inst_pp_wm.html. Read and follow the installation instructions.

3.3.3 Installing the MDA-II Handset UI Application

Note that this application will be found in the files that were already unzipped on the PC as described in Section 3.1.1.

From the demo package, the directory MDA_DTV contains a subfolder called "mms_client". There should be 3 files:
"application.properties"
"Dropletjar"
"Droplet.lnk"

Copy the files "application.properties" and "Droplet.jar" from the PC to the MDA directory: †ProgramFiles\J9\PPRO10\examples.

Copy the file "Droplet.lnk" to the MDA directory \Windows\Start Menu.

To verify the MDA-II has been configured correctly, click on the Start menu. An icon called Droplet should now be available.

To verify the functionality, select the Droplet icon and a new window pops up. It will have 3 buttons:
Download/install codec
Capture Video
Send Video Message Note: source code for the MDA-II Handset UI Application is available under the directory MDA_DTV\mms_client_src as a reference.

The MDA-II has now been configured for the demo.

3.3.4 Installing the Pictpocket Cinema Video Player (Optional)

This step is optional, since the default video player on the MDA-II can view the decoded Droplet video file. By installing a third party video player, this demonstrates that the present invention's decoded video files are compatible with multiple mobile device video players.

On the MDA-II handset, the "Pictpocket Cinema" application from Digisoft has been installed.

A 14-day trial version of Pictpocket Cinema can be downloaded from the vendor's website: www.digisoftdirect.com.

3.4 Configuring the Xphone

Connect the Xphone to the PC via the USB cable.

3.4.1 Modifying the Registry Entries for Stable GPRS Connection

To ensure a stable GPRS connection, the timeout period needs to be increased to greater than the default setting of 60 sec. The handset manufacturer (HTC) has provided the recommended registry changes. If there is no Registry Editor installed on the device, first install the registry editor included in Droplet's Demo package under the "PHMRegEditor" directory.

Place the file PHMRegEdit.msi in the Temp directory on your PC
Place the CAB files regedit.Mrln_ARM.CAB in the same directory on the PC
Run PHMRegEdit.msi by double-clicking on it and follow the instructions
Synchronize the PC with the Xphone
Copy the file regedit.Mrln_ARM.CAB to the Windows directory on the Xphone
Double-click on that file in the Xphone and it will install the CAB files appropriately
Run PHMRegEdit.msi and follow the instructions.
The resulting program PHMEditor will be installed on the Xphone in the directory \Program Files\PHM Tools
Start the program regedit (the registry editor) from the above directory
Select
HKEY_LOCAL_MACHINE\SOFTWARE\Microsoft\ConnMgr\Planner\Settings
Change the setting for CacheTime to 300 (this is 5 min. timeout period)
Change the setting for SuspendResume to ~GPRS! (should allow for no timeout)
Exit the registry editor.
Perform a soft reset to allow the modified settings to take effect 3.4.2 Installing Ewesoft JVM
From the Droplet demo package, in the directory Ewesoft will be a file called Ewe143-CAB-SmartPhone.zip. Unzip this file on the PC. Use the file called Ewe-SmartPhone2003.arm.CAB.
Copy the Ewe-SmartPhone2003.arm.CAB file to the Xphone directory called: Storage\windows\Start Menu\Accessories
Go to Start→Accessories. The CAB file should be displayed as a menu item. Select the CAB file and the VM will then be installed
The installation will create a new Ewe folder that will appear in the Start menu.
Within that folder you will find the Ewe VM itself and a "Solitaire" demo application with which to verify correct installation.

3.4.3 Installing the Xphone Handset UI Application
From the Droplet demo package, in the directory Xphone_DTV will be a subfolder called "mms_client". There should be 3 files.
"application.properties"
"Droplet.jar"
"Droplet.lnk"
Copy the files "application.properties" and "Droplet.jar" from the PC to the Xphone directory: /Storage/windows/StartMenu/Ewe/.
Copy the file "Droplet.lnk" to the Xphone directory: /Storage/windows/StartMenu/.
To verify the Xphone has been configured correctly, click on the Start menu. An icon called Droplet should now be available
To verify the functionality, select the Droplet icon and a new window pops up. It will have 3 buttons:
Download/install codec
Capture Video
Send Video Message
The Xphone has now been configured for the demo Running the Demo 4.1 Downloading and Installing the Video Codec on the MDA-II
From the MDA, click on the Start menu and a Droplet icon should appear on the list.
Select the Droplet icon and a new window pops up. It will have 3 button selections:
Download/Install codec
Capture Video,
Send Video Message.
Click on Download/Install codec button
The following messages should appear
Connect to FTP host: xx.xx.xx.xxx (This should be the IP address of the server)
Connected
Log in server
Logged in
Start downloading Codec file
Downloading completed
The Video Codec was successfully installed. Disconnect
To verify that the codec was downloaded successfully, go to the My Documents directory on the MDA. A file called DtvMDADemo.exe should be present with the date and timestamp of when it was downloaded.

4.2 Recording a Video Message with the Handset
In this version of the demo, the MDA-II handset is used to encode/compress high quality uncompressed live video input from an external video camcorder. While the MDA-II has a VGA capture camera, it can only capture still images at that resolution. The video capture of the MDA-II is limited to QCIF, 10 fps video that is automatically compressed in 3GPP format on the device.

4.2.1 Connecting the Camcorder to the PC
Connect the Canon camcorder to the PC using the Firewire (1394) cable. The camcorder has a 4-pin connector receptacle.
Once the Firewire cable is connected and the camcorder is turned on in "Camera" mode, the PC OS (Windows XP Professional in this demo version) will prompt for capture with several options.
Select "Windows Movie Maker" which will bring in the Movie Maker application.

4.2.2 Capture a Video Sequence from the Camcorder on the PC
Within Movie Maker select "Capture from video device" and choose a name for the captured file and location to store it on the PC.
The next screen will ask for video settings; select "Digital Device Format (DV-AVI)". That will capture the video in DV format, which is a high quality (almost lossless) video capture format.
The next screen will show a preview window of the captured video as well as interface to "Start Capture" and "Stop Capture". Since many wireless handsets do not have a large amount of onboard memory, it is suggested that 2-3 seconds of full motion video (60-90 frames) is recorded for faster computation.
Once the video sequence is recorded, the Windows Movie Maker program can be exited.
For this document it is assumed that the name of the recorder file is "testDV.avi" (note that the file is in .AVI format—interleaved audio-video file with all individual frames arranged one after the other).

4.2.3 Uncompress the DV Video Sequence on the PC
The recorded video in the previous step is in compressed DV format (720×480 pixels, 30 fps at about 28 Mbps) with integrated audio. To simulate full motion capture, the video should be uncompressed in common UYVY format, scaled down to VGA size (640×480 pixels), and the audio information removed.

For this demo, it is necessary to create two source files for the MDA to encode: one for VGA (640×480) @ 30 fps and one for QCIF (160×144) @ 15 fps.

From the VirtualDub1.6.3 directory run the "VirtualDub.exe" executable.

a. In "File" use the "Open video file" option to load the "testDV.avi" file
b. In "Audio" select "No audio" option
c. In "Video" select "Filters" option. Choose "Add" and scroll down the menu to locate the "resize" filter. Set the "New width" at 640 and "New height" at 480. Set "Filter Mode" at "Precise Bicubic (A=0.75)".
d. In "Video" select "Color depth". Set in the right column the output format to "4:2:2 YCbCr (UYVY)" format.
e. Make sure that in "Video" the "Compression" option is set to "Uncompressed RGB/YCbCr".
f. If a very long video sequence has been captured, it can be shortened by selecting in "Video" the "Select range" option. Typically 60-90 frames (2-3 seconds of video) is a reasonably large size of video to manipulate. The start can be from the beginning ("Start offset" of 0) or somewhere in the middle of the sequence, depending on the video that is captured. For example a 2 seconds (60 frames) uncompressed UYVY video VGA (640×480) sequence is 36 MB of data on the computer.
g. Select "File" and "Save as AVI . . . " to save the resulting uncompressed file. Call the file "testVGA_UYVY.avi". This is now the raw (uncompressed) UYVY VGA input file to be encoded/compressed on the MDA-II handset.

To create a file for QCIF (recommended for sending a video clip to another handset via a GPRS connection):
In step c, enter 160 for the "New width". Enter 144 for the "New height"
In step g, name the file "testQcif_UYVY.avi".

4.2.4 Transfer the Uncompressed Video Sequence to the MDA-II Handset

Transfer the uncompressed video files "testVGA_UYVY.avi" and "testQcif_UYVY.avi" from the PC to the MDA
Copy these files into the My Documents directory on the MDA-II for compression.
For intermediate storage, the above large source files (uncompressed video input) can also be placed on the "Storage Card" of the device, and then copied to the My Documents directory for compression.
Disconnect the MDA from the PC At this point the uncompressed video sequence is in the handset and ready to be compressed with the present invention's "Droplet" encoder software previously downloaded and installed on the handset 4.2.5 Compressing the Native Video Sequence in the MDA-II Handset Now that the video codec and the uncompressed video sequence have been successfully downloaded to the MDA-II handset, the handset is ready to perform the encode/compression.

On the MDA, go to the MyDocuments directory
Find and select the "DtvMDADemo" application.
A UI window will pop up allowing the user to enter information:
Source file: The name of the file containing the uncompressed video in UYVY format. (This was the file that was generated in the previous step)
Destination file: The name of the file where the compressed video sequence will be stored (The compressed file will have an extension ending in .dtv). For this demo, leave the file name at bitstream.dtv Horizontal and vertical frame size.
For encoding VGA video, the parameters will be 640 and 480 respectively.
For encoding QCIF video, the parameters will be 160 and 144 respectively.
Type of input file: YUV 4:2:2 by default
Compression rate: Level 12 by default
Range of frames to be compressed: Typically set to "All". (Note: if the user chooses to change this, the total number of frames specified must be an even number because DTV processes 2 frames as a group of pictures)
Select "Encode", "Decode", or both.
Select Start.

Upon successful completion, the compressed bitstream.dtv file specified in the destination file field above will have been created in the directory in "My Documents" on the MDA-II.
If the file name was changed, it is important to keep the .dtv file extension.
Reminder: the above encoding should be done twice, once for VGA/30 fps and once for QCIF/15 fps
The decompressed QCIF files are also kept in "My Documents\DTV Output" on the MDA-II, for MMS transmission to other handsets via the GPRS network.

4.3 Transfer/Playback of VGA/30 fps Video Message on PC

To play the encoded VGA file on the PC requires transferring the file from the MDA-II to the PC. At current GPRS data transfer rates (~20-40 Kb/s), it should take approximately 16 seconds to send 1 second of compressed VGA video over the mobile network. Higher speed 3G or WiFi networks will eventually enable more efficient transfer of full VGA/30 fps video files. For this demo, the USB connection between the MDA-II handset and the PC is used to expedite the file transfer.

Connect the MDA-II to the PC via the cradle/USB. (Note that this is the standard method by which current digital cameras & camcorders are connected to home PCs in order to transfer digital photos and videos)
Copy the encoded/compressed VGA file (\My Document\bitstream.dtv) from the MDA-II to the PC. The file should be copied to the following directory: "C:\DTV_PCplayer_Demo\".
Since the MDA-II device is equipped with a USB1 port, faster transfer of the VGA/30 fps files to a USB2 enabled PC can be accomplished by first copying them to the removable memory card in the MDA-II, and then removing the card and using a USB2 card reader for transfer, by connecting it directly to the USB2 port on the PC.
Once file transfer is complete, go to the "C:\DTV_PCplayer_Demo\" directory in the PC and double click the file "dtvplayer.grf" or "dtvplayer_Win2K.grf" (OS dependent), and then click on the "Play" button (or select "Play" menu item) to view the VGA/30 fps video.
To stop a clip you can simply exit the application (GraphEdit).

4.4 Sending QCIF/15 fps Video as an MMS Message via GPRS

This section will demonstrate the ability to send the compressed QCIF/15 fps video from the MDA-II handset to the MMS server via GPRS. From there, an SMS notification will be sent to the targeted handset (in this case the Xphone), indicating that a video MMS is ready for download and playback. Alternatively, an email notification will be sent if the targeted receiving device is a networked computer.

4.4.1 Sending QCIF/15 fps Video to MMS Server Via GPRS

Click on the MDA-II Start menu and a Droplet icon will appear on the menu list.
Select the Droplet icon and a new window pops up. It will have 3 button selections:
Download/Install codec
Capture Video,
Send Video Message.
Click on the "Send Video Message" button
A new window to select files will open.
Select the file that you want to send (in this case the compressed QCIF/15 fps video file).
A new window will open, to enter the target phone number/email address.
If an email address is entered (determined by the presence of the @ symbol) then the selected file will be sent with email notification.
If a string of digits without "@" is entered, then the file/SMS notification will be sent to mailto: "string"@tmomail.net, corresponding in this case to a T-Mobile subscriber with the phone number entered as "string".
To send the compressed video as an MMS message to the Xphone, enter the handset's phone number.
The user will be prompted to establish the GPRS connection. This can be accomplished, for example, by launching Internet Explorer and going to any well-known URL.
Once the GPRS connection has been established successfully, click "OK"
A new window opens where the following status messages should appear.
Connect to FTP host: xx.xx.xx.xxx (This should be the IP address of the MMS server)
Connected
Log in server
Logged in
Changing directory to: public_html
Changed
Start uploading video file: <selected video file name>.dtv
Uploading completed
Start uploading link file: <selected video file name>.lnk
Uploading completed
The video file was successfully sent. Disconnect.
Note: Two new files will show up in the public_html directory on the ftp server (<filename>.dtv and <filename>.lnk)

4.4.2 SMS Notification is sent from the MMS Server

A script running on the server polls the ftp location public_html and determines that new files are present.
When a new file is present, the server script will parse the <new file>.lnk file and extract the name of the video file to be sent and the destination handset # or email address.
The script will then send the SMS notification message to the target destination either via email or mobile SMS.

4.4.3 Receiving Handset Downloads Video Message and DTV Decoder

This section will demonstrate the ability to receive the SMS notification on the Xphone, and to connect to the MMS server and download the QCIF/15 fps video file together with the DTV decoder. Upon receipt of the video file and decoder, the file will be decoded and played on the Xphone.
The Xphone will receive an SMS message.
Open the SMS message. Inside will be the location from which the video file can be downloaded.
Downloading the DTV video file.
Open Internet Explorer
Type in the URL under which the video file is located
The video file will be downloaded to the Xphone.
Additionally, the Xphone video decoder needs to be downloaded (if it is not already present on the Xphone). Once downloaded, the Xphone decoder file (DtvXphoneDemo.exe) should be placed into the My Documents directory on the Xphone.
Run the DtvXphoneDemo.exe
A UI window will pop up allowing the user to enter information (the application will default to processing the bitstream.dtv file):
Horizontal and vertical frame size.
For decoding QCIF video, the parameters will be 160 and 144 respectively.
Range of frames to be compressed: Typically set to "All". (Note: if the user chooses to change this, the total number of frames specified must be an even number because DTV processes 2 frames as a group of pictures)
All other fields will be ignored.
Select "Decode".
Select Start.
This will create an uncompressed AVI file, which can be played by most video players found on mobile handsets.
To play the video file on the Xphone, simply click on the created file and the resident Microsoft Media Player will play the video:

4.4.4 Use of Alternate FTP Connection on Xphone

In order to demonstrate the flexibility enabled by the present invention's Droplet all software video messaging platform, the use of a simple. Smartphone FTP application to download the QCIF/15 fps video messages and Droplet decoder to the Xphone handset is also demonstrated.
The Orneta FTP application for Windows Smartphones devices on the Xphone is used.
The Orneta FTP application installer can be downloaded to the PC from: http://www.handango.com/PlatformProductDetail.jsp?productType=2&platformId=11&siteId=1&SectionId=0&catalog=1&productId=87548
Follow the instructions to install Orneta FTP using the PC with the Xphone connected
Obtain a free Registration Code from: http://x.msmobiles.com/free-smartphone-software/default.aspx
To use the Orneta FTP application on the Xphone to download video messages and the Droplet decoder from the MMS server:
Start a GPRS connection
Launch the Orneta FTP application from the Start menu
Under Menu/Settings/Set Download Folder, select choose \windows
Connect to the specified MMS server (same as in Section 4.1, for example)
Download: select the Droplet video encoder "DtvXphoneDemo.exe"
Under Menu/Settings/Set Download Folder, select \Storage\My Documents\
Connect to the MMS server again
Download: select the QCIF/15 video file, i.e. "bitstream.dtv"
Exit
This concludes the discussion of Example 1.

Aspects of the present invention comprise, in part, an all-software camcorder phone application capable of real-time capture of full (VGA)-size images (640×480) at 30 frames per second (fps), which may use only a single standard RISC processor already incorporated in the vast majority of multimedia handsets. In contrast, within the battery power constraints of mobile handsets, current MPEG-based camcorder phones support real-time capture of images that are limited to QCIF or CIF size (1/16th or 1/4 the size of VGA) at 4-15 fps. Yet even these small, choppy video clips require complex and expensive handset platform designs, in which the video functions are implemented as a combination of hardware and software, and partitioned between multiple processing devices: RISC processors, ASIC, and DSPs.

With regard to the mobile operator environment, aspects of the present invention's low-complexity video processing and distribution technologies are integrated into a powerful new and inventive all-software video messaging platform that enables turnkey deployment using existing mobile handsets and mobile Multimedia Messaging Service controller (MMSC) infrastructure. Complementing the above mobile camcorder application, embodiments of the present invention's content management platform provide modules for integrating the invention's compressed images and videos together with sounds and text into complete mobile multimedia messages and "ring-tones", along with on-the-fly editing, thumbnail previews, multimedia mailboxes, on-line repository services, and subscription management.

Performance Comparison

Aspects of the present invention's video codecs offer customers a 30-40× reduction in power consumption (both SW and HW implementations—see Table 1) when compared to optimized MPEG-2/MPEG-4 codecs. HW product implementation costs are significantly reduced via a 10× reduction in the number of CMOS gates required, from approximate ~1 million to ~100,000, and hence in the corresponding silicon real estate requirements. For full size (VGA) and full-frame-rate (30 fps) video processing, the present invention's innovative video codec designs also reduce internal memory requirements from several megabytes to 128 kilobytes, freeing up on-board memory resources in mobile handsets for other revenue-generating features and applications. The present invention's codecs are also able to efficiently process both still images and video, and can thus replace separate MPEG and JPEG codecs with a single lower-cost and lower-power solution.

Although significantly applicable at supporting the deployment of VGA, 30 fps camcorder phones and related services, the present invention's unique mobile video platform technologies also offer significant benefits across a broad range of other mobile video services, via a combination of: scalable image size: QCIF (176×144)—D1 (720×480), simplified video editing (cuts, inserts, text overlays, etc.), simplified synchronization with voice codecs, and low latency for enhanced video streaming performance.

TABLE 1

Codec Performance Comparison: Mobile Handset Applications

| Company | Image Format | Frame Rate | |
|---|---|---|---|
| Hardware Codecs (ASIC) | | | |
| | | | Power Consumption (mW) |
| Hantro[ref 1] | QCIF | 15 fps | 11 |
| Fujitsu[ref 2] | QCIF | 15 fps | 13 |
| Droplet | VGA | 30 fps | 10 |

TABLE 1-continued

Codec Performance Comparison: Mobile Handset Applications

| Company | Image Format | Frame Rate | |
|---|---|---|---|
| SW Codecs | | | |
| | | | Processor Utilization (MHz on ARM-9) |
| Hantro/Motorola[ref 3] | QCIF | 15 fps | 190 |
| Droplet | QCIF | 15 fps | 30 |
| Droplet | VGA | 30 fps | 150 |

The present invention also comprises MMS infrastructure products enabling deployment of premium video messaging services in conjunction with the inventive SW video codec/camcorder applications for mobile handsets. Additional aspects of the invention comprise advanced transcoding applications support complete interoperability with other commonly-deployed standards-based and proprietary video formats. Additionally included is a content management platform that provides modules for integrating the invention's compressed images and videos together with sounds and text into complete mobile multimedia messages and "ring-tones", along with a suite of corresponding MMS message management capabilities. This content management platform can be used by wireless operators and MMS service providers both as a set of SW modules, for rapid and cost-effective upgrades to existing MMS infrastructure, and as a stand-alone server for new MMS controller installations. The inventive MMS infrastructure products may include:

| Product | Description |
|---|---|
| DTV-VGT Video Gateway Transcoder: | SW Transcoder application for upgrading existing MMS Video Gateways to support conversion of video content between Droplet DTV format and other video formats such as MPEG-2, MPEG-4, Motion-JPEG, Microsoft Media, and RealVideo. |
| DTV-CMP SW Content Management Platform: | Suite of content management SW modules for upgrading existing MMS Message Application Servers: creation of MMS messages and "ring-tones" that integrate the present invention's compressed images and videos together with sounds and text, on-the-fly editing, thumbnail previews, multimedia mailboxes, on-line repository services, and subscription management. |
| DTV-CMS Content Management Server: | Server-based integrated SW content management platform, for new MMSC deployments. |

The present invention also comprises a Content Management Service Platform that with SW Modules or Stand-Alone Server may include:
    Mobile Multimedia Composer: Integrates the present invention's improved wavelet-compressed images and videos with sounds and text in one message.
    Preview Player: Provides "thumb-nail" previews of the present invention's wavelet-compressed images, videos, and integrated MMS messages
    Mobile Multimedia Editor: Enables on-the-fly editing of the present invention's wavelet-compressed images, videos, and integrated MMS messages with tools and filters.

Multimedia Ring-Tone Creator: Allows users to create personal multimedia "ring-tones", by combining polyphonic ring-tones and other sounds with wavelet-compressed images and videos.

Mobile Multimedia Album or "Mblog": Repository for the present invention's wavelet-compressed images, videos, and integrated MMS messages.

Mobile Multimedia Subscription Management: Copy/forward the present invention's wavelet-compressed images, videos, and integrated MMS messages; purchase additional storage; purchase DVD hard copies.

Mobile Multimedia Mail-Box: SMS-managed In-box and Out-box for the present invention's integrated MMS messages.

Mobile Multimedia Address Book: Management of Mobile Multimedia contacts.

It should be noted that embodiments of the present invention may provide:

Flexible, rapid, and cost-effective OTA/OTN upgrades increase ROI from installed MMS infrastructure Advanced transcoding supports complete interoperability with other commonly-deployed standards-based and proprietary video formats.

Content management platform available as suite of SW modules for upgrading existing MMS infrastructure, or as a stand-alone server for new MMS installations JSR-135: Mobile Media API Specification The present invention's DTV-JVC Java Video Codec generates decompressed video images that support all Player Functionality defined in Java Community Process JSR-135 including the following:

Int getDisplayHeight( )
    Return the actual height of the current render video.
Int getDisplayWidth( )
    Return the actual width of the current render video.
Int getDisplayX( )
    Return the X-coordinate of the video with respect to the GUI object where the video is displayed.
Int getDisplayY( )
    Return the Y-coordinate of the video with respective to the GUI object where the video is displayed.
byte[ ] getSnapshot(java.lang.String imageType)
    Get a snapshot of the displayed content.
int getSourceHeight( )
    Return the height of the source video.
int getSourceWidth( )
    Return the width of the source video.
java.lang.Object initDisplayMode(int mode, java.lang.Object arg)
    Initialize the mode on how the video is displayed.
Void setDisplayFullScreen(boolean fullScreenMode)
    Set the size of the render region for the video clip to be fullscreen.
Void setDisplayLocation(int x, int y)
    Set the location of the video with respect to the canvas where the video is displayed.
void setDisplaySize(int width, int height)
    Resize the video image.
Void setVisible(boolean visible)
    Show or hide the video.

JSR-234: Advanced Multimedia Supplements

The present invention's DTV-JVC Java Video Codec generates decompressed video images that support all Player Effect Controls defined in Java Community Process JSR-234 including the following:

mageFilterControl
ImageFilterControl is an image effect that can be used to set various image filters such as monochrome and negative.
ImageTonalityControl
ImageTonalityControl is an effect that can be used to set various image settings such as brightness, contrast, and gamma.
ImageTransformControl
ImageTransformControl is used to crop, zoom, mirror, flip, stretch, and rotate images.
OverlayControl
OverlayControl controls the setting of overlay images on top of video or still images.
WhiteBalanceControl
WhiteBalanceControl is an image/video effect for altering the white balance.

The present invention also comprises products, methods and processes for establishing, providing and operating a mobile video blog service. This service provides every user having a video phone with the ability to: shoot, edit, save, share, and "publish" their personal videos and movies online.

With respect to users, aspects of the present invention's products for mobile video blog service, code named "Mobedia", provide:

1. The Mobedia SW Camcorder application which can be pre-installed in mobile handsets, or users can download and install it on any Java enabled video phone.
2. Using the Mobedia SW Camcorder application, users can record full VGA/30 fps (or even higher quality) video using their mobile handsets.
3. Using the Mobedia SW Cinema application, users can browse/edit takes, add titles, etc., and "splice" multiple takes to create personal movies, using the present invention's SW camcorder application.
4. A simple version of the Mobedia SW Cinema application may be distributed to users free of charge, while a more powerful "Cinema-Pro" version may be purchased by users.

With regard to servers, termed Mobedia servers, aspects of the present invention may provide:

5. Using Mobedia handset client SW, users can send Video takes to Mobedia servers, via mobile, fixed wireless, or wireline connections.
6. Mobedia subscription service allows users to archive video takes and movies on the server (paid storage), carry out further editing online, download and save video in a variety of popular formats, or order copies on DVD (paid).
7. Mobedia subscription service allows users to create movie albums on the Mobedia site, and invite friends, family, colleagues, etc. to view their movies, or order their own copies on DVDs (paid) as gifts, etc.

With respect to friends, family, and etc., Mobedia type aspects of the present invention provide:

8. Friends, family, colleagues, etc., receive email invitations to view the user's movies, download and save copies (paid), or order their own copies on DVD (paid).

With respect to general audience (cinema model), Mobedia aspects of the present invention provide:

9. Droplet's Mobedia subscription service allows users to "publish" their movies for the General Public to view on the Mobedia Cinema site.
10. The General Audience can search the archive of published movies by ranking, subject, category, etc., and view free previews on the Mobedia Cinema site.
11. The General Audience can pay to view, download, or order a copy on DVD.

The following methods and processes comprise aspects of the present invention and are exclusively enabled by the present technology.

Revenue Sources/Business Model:
- Film makers: pay for server space, downloading files, and ordering DVDs. Pay for enhanced versions of editing software.
- Friends, family, etc.: pay for downloading files and ordering DVDs
- General Audience: pays for watching full movies (only previews are free), ordering DVDs or downloads.
  - Film maker may get a share of fees paid by General Audience
- Mobile Operators: pay for increased data traffic via revenue-sharing model Service components of aspects of the present invention comprise:
- the present invention's Mobile Video Messaging Platform (server and handset SW applications) to capture, send, and manage personal video content
- the present invention's Mobedia SW Video Camcorder application enables video shooting on any java/video phone
- the present invention's Mobedia SW Video Cinema client applications include basic video production, editing, and viewing technology (simple and Pro versions)
- the present invention's Mobedia SW Video Cinema web-based Content Management applications support Mobedia Cinema movie albums, personal moving sharing, and Mobedia Cinema "publishing".

Presented herein is an improved mobile imaging application, handset architecture, and service platform architecture, which combine to substantially reduce the technical complexity and costs related with offering high-quality still and video imaging services to mobile subscribers. Improved adaptive joint-source channel coding technique is the corresponding ability of wireless carriers and MMS service providers to offer a greater range of quality-of-service (QoS) performance and pricing levels to their consumer and enterprise customers, thus maximizing the revenues generated using their wireless network infrastructure. Improved adaptive joint-source channel coding, based on algorithms with higher computational efficiency, enables support for a much higher level of network homogeneity, in terms of channel types (wireless and wire line), channel bandwidths, channel noise/error characteristics, user devices, and user services. Additionally provided are methods, devices, processes and business methods providing innovative and enhanced services in the field of still and moving video in the mobile telephone fields.

Additionally provided as aspects of the present invention are the following in summary form.

Mobile imaging applications utilizing improved wavelet-based codec, as an all-SW implementation, an all-HW implementation, or as a hybrid SW+HW implementation.

Also provided are systems and methods comprising improved joint source-channel coding using fine grain scalability of the improved wavelet-based codec described above, utilizing information on both instantaneous and predicted channel bandwidth and error conditions in all three of the source coder, the channel coder, and the adaptive rate controller to maximize control of both the instantaneous and average quality (video rate vs. distortion) of the reconstructed video signal. Also provided are systems and methods that can be applied to a greater range of quality-of-service (QoS) performance and pricing levels for consumer and enterprise MMS customers, support for a much higher level of network heterogeneity, in terms of channel types (fixed wireless, mobile wireless, and wire line), channel bandwidths, channel noise/error characteristics, user devices, and user services, including improved multicasting.

Also provided is a mobile camcorder application—combining aspects of the two preceding paragraphs with related image pre-processing and post-processing functions, and voice recording, for full camcorder capability in mobile devices, either as an all-SW implementation, an all-HW implementation, or as a hybrid SW+HW implementation.

Also provided is a mobile imaging application utilizing improved wavelet-based codec, implemented as Java application, as an all-SW implementation, an all-HW implementation, or as a hybrid SW+HW implementation.

Also provided is a mobile camcorder application—combining the application of the preceding paragraph above with related image pre-processing and post-processing functions, and voice recording, for full camcorder capability in mobile devices, either as an all-SW implementation, an all-HW implementation, or as a hybrid SW+HW implementation.

Also provided is imaging-enabled mobile handset architecture using as pects and features of the preceding paragraphs of this summary, where the mobile imaging application is incorporated in the handset baseband multimedia processing section of the handset, in the imager module, or in a removable storage medium.

Also provided is OTA delivery or upgrade of the above features of this summary above into imaging-enabled handset described above.

Also provided is a system enabling point of sale installation or upgrade of the above features and systems above into an imaging-enabled handset.

Also provided is a mobile imaging transcoder for universal compatibility of the above features of this summary with other standards-based or proprietary imaging formats—all SW application delivered to and installed in an MMSC Video Gateway via automated OTN upgrade or via manual procedures.

Also provided is a mobile imaging service platform architecture, method and system—combining all the features of this summary.

While the above is a description of certain aspects of embodiments of the invention, various alternatives, modifications, and equivalents may be used. Therefore, the above description should not be taken as limiting the scope of the invention which is defined by the appended claims.

What is claimed is:

1. A method of remotely playing a video sequence, comprising:
- downloading a first video codec to a first telephone device over the air (OTA) and installing the first video codec in the first telephone device,
- using the first video codec to compress a video sequence captured by the first telephone device,
- establishing a connection between the first telephone device and a wireless network,
- determining a change in at least one of a transmission bandwidth and a transmission error rate over the wireless network,
- in response to the determined change, changing the operating compression parameters of the first video codec in response to the determined change,
- applying the changed operating compression parameters of the first video codec while compressing the video sequence,
- sending the compressed video sequence from the first telephone device to a multimedia messaging service server, sending a notification to a remote video player device that the compressed video sequence is available for download, downloading the compressed video sequence together with a second video codec for self-playing the video sequence to the remote video player in response to the remote video player receiving the notification that the compressed video sequence is available for download, using the downloaded second video codec on the remote video player to decode the compressed video sequence into a decoded video sequence, and using a video player, installed on the remote video player device prior to the step of downloading, to play the decoded video sequence.

2. The method of claim 1, wherein: the remote video player device comprises a second telephone device.

3. The method of claim 1, wherein:

using the downloaded second video codec to decode the compressed video sequence comprises converting the video sequence from a first video file format to a second video file format that can be played by the remote video player device prior to the step of downloading.

4. The method of claim 1, further comprising:

downloading a channel encoder to the first telephone device, installing the channel encoder in the first telephone device, in response to the determined change, changing the process of the channel encoder in response to the determined change.

* * * * *